United States Patent
Gritsenko et al.

(10) Patent No.: US 11,843,459 B2
(45) Date of Patent: Dec. 12, 2023

(54) SPATIALLY COUPLED FORWARD ERROR CORRECTION ENCODING METHOD AND DEVICE USING GENERALIZED ERROR LOCATING CODES AS COMPONENT CODES

(71) Applicant: Huawei Technologies Co., Ltd., Shenzhen (CN)

(72) Inventors: Vladimir Vitalievich Gritsenko, Moscow (RU); Vladislav Nikolaevich Obolentsev, Moscow (RU); Dmitrii Yurievich Bukhan, Moscow (RU); Aleksei Eduardovich Maevskii, Moscow (RU); Hongchen Yu, Beijing (CN); Kun Gu, Beijing (CN); Jie Chen, Wuhan (CN); Shiyao Xiao, Chengdu (CN); Man Zhao, Chengdu (CN); Jun Chen, Chengdu (CN); Yunlong Li, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/837,916

(22) Filed: Jun. 10, 2022

(65) Prior Publication Data
US 2022/0376819 A1 Nov. 24, 2022

Related U.S. Application Data

(63) Continuation of application No. PCT/RU2019/000942, filed on Dec. 13, 2019.

(51) Int. Cl.
*H04L 1/00* (2006.01)

(52) U.S. Cl.
CPC ......... *H04L 1/0041* (2013.01); *H04L 1/0045* (2013.01); *H04L 1/0071* (2013.01)

(58) Field of Classification Search
CPC ... H04L 1/0041; H04L 1/0045; H04L 1/0058; H04L 1/0071; H03M 13/2757;
(Continued)

(56) References Cited

U.S. PATENT DOCUMENTS 8,276,047 B2 9/2012 Coe
8,751,910 B2 6/2014 Farhoodfar et al.
(Continued)

FOREIGN PATENT DOCUMENTS

EP 3232576 A1 10/2017
WO 2017078562 A1 5/2017

OTHER PUBLICATIONS

Lei M Zhang, Spatially-coupled split-component codes with iterative algebraic decoding, IEEE, pp. 1 to 30. (Year: 2015).*
(Continued)

*Primary Examiner* — Shelly A Chase
(74) *Attorney, Agent, or Firm* — Leydig, Voit & Mayer, Ltd.

(57) ABSTRACT

The present disclosure provides an encoding and decoding device implementing an improved forward error correction (FEC) coding/decoding method. In particular, the encoding device is configured to encode a stream of data symbols using a spatially coupled code (e.g. staircase codes, braided block codes or continuously interleaved block codes), wherein at least one generalized error location (GEL) code is used as a component code of the spatially coupled code. Accordingly, the decoding device is configured to decode a sequence of encoded symbol blocks using a spatially coupled code, wherein at least one GEL code is used as a component code of the spatially coupled code. Thereby, a suitable spatially coupled FEC code that allows for very low-latency, high-throughput, high-rate applications with a
(Continued)

1200

1201 — Decode a sequence of encoded symbol blocks using a spatially coupled code, wherein at least one generalized error location, GEL, code is used as component code of the spatially coupled code.

low-complexity decoding procedure, and allows for mitigation of the error-floor, is designed.

14 Claims, 15 Drawing Sheets

(58) Field of Classification Search
CPC ........... H03M 13/6306; H03M 13/618; H03M 13/6362; H03M 13/116; H03M 13/1128; H03M 13/1177
See application file for complete search history.

(56) References Cited

U.S. PATENT DOCUMENTS

| | | | | |
|---|---|---|---|---|
| 2016/0164538 A1* | 6/2016 | Abu-Surra | ........ | H03M 13/6306 714/776 |
| 2018/0102791 A1* | 4/2018 | Zhang | ................... | H04L 1/0058 |

OTHER PUBLICATIONS

Tang et al., A novel method for combining algebraic decoding and iterative processing, IEEE, pp. 474-478 (Year: 2006).*

Maucher et al., "On the Equivalence of Generalized Concatenated Codes and Generalized Error Location Codes," IEEE Transactions on Information Theory, vol. 46, No. 2, pp. 642-649, Institute of Electrical and Electronics Engineers, New York, New York (Mar. 2000).

Jimenez Feltstrom et al., "Braided Block Codes," IEEE Transactions on Information Theory, vol. 55, No. 6, pp. 2640-2658, Institute of Electrical and Electronics Engineers, New York, New York (Jun. 2009).

Smith et al., "Staircase Codes: FEC for 100 GB/s OTN," Journal of Lightwave Technology, vol. 30, No. 1, pp. 110-117, Institute of Electrical and Electronics Engineers, New York, New York (Jan. 1, 2012).

Scholten et al., "Continuously-Interleaved BCH (CI-BCH) FEC delivers best in class NECG for 40G and 100G metro applications," 2010 Conference on Optical Fiber Communication (OFC/NFOEC), collocated National Fiber Optic Engineers Conference, Total 3 pages, Institute of Electrical and Electronics Engineers, New York, New York (Mar. 21-25, 2010).

Fahrner et al., "Low Complexity GEL Codes for Digital Magnetic Storage Systems," IEEE Transactions on Magnetics, vol. 40, No. 4, pp. 3093-3095, Institute of Electrical and Electronics Engineers, New York, New York (Jul. 2004).

Justesen "Performance of Product Codes and Related Structures with Iterated Decoding," IEEE Transactions on Communications, vol. 59, No. 2, pp. 407-415, Institute of Electrical and Electronics Engineers, New York, New York (Feb. 2011).

Jian et al., "Iterative Hard-Decision Decoding of Braided BCH Codes for High-Speed Optical Communication," 2013 IEEE Global Communications Conference (GLOBECOM), pp. 2376-2381, Institute of Electrical and Electronics Engineers, New York, New York (Dec. 9-13, 2013).

Zhang et al., "Staircase Codes With 6% to 33% Overhead," Journal of Lightwave Technology, vol. 32, No. 10, p. 1999-2002, Institute of Electrical and Electronics Engineers, New York, New York (May 15, 2014).

Kukieattikool et al., "Staircase Codes for High-Rate Wireless Transmission on Burst-Error Channels," IEEE Wireless Communications Letters, vol. 5, No. 2, pp. 128-131, Institute of Electrical and Electronics Engineers, New York, New York (Apr. 2016).

Tzimpragos et al., "A Survey on FEC Codes for 100 G and Beyond Optical Networks," IEEE Communication Surveys & Tutorials, vol. 18, No. 1, pp. 209-221, Institute of Electrical and Electronics Engineers, New York, New York (First Quarter 2016).

Hager et al., "Approaching Miscorrection-Free Performance of Product Codes With Anchor Decoding," IEEE Transactions on Communications, vol. 66, No. 7, pp. 2797-2808, Institute of Electrical and Electronics Engineers, New York, New York (Jul. 2018).

Cai et al., "FPGA Investigation on Error-Floor Performance of a Concatenated Staircase and Hamming Code for 400G-ZR Forward Error Correction," 2018 Optical Fiber Communications Conference and Exposition (OFC), Total 3 pages, Institute of Electrical and Electronics Engineers, New York, New York (2018).

Holzbaur et al., "Improved Decoding and Error Floor Analysis of Staircase Codes," pp. 1-18 (Dec. 3, 2018).

Hu et al., "Beyond 100Gbps Encoder Design for Staircase Codes," 2016 IEEE International Workshop on Signal Processing Systems (SiPS), pp. 154-158, Institute of Electrical and Electronics Engineers, New York, New York (2016).

Yu et al., "FPGA Demonstration of Stretched Continuously Interleaved BCH Code with Low Error Floor for Short-Range Optical Transmission," 2017 Optical Fiber Communications Conference and Exhibition (OFC), Total 3 pages, Institute of Electrical and Electronics Engineers, New York, New York (2017).

Bossert "Decoding of Generalized Concatenated Codes," Total 2 pages (First Online: Jan. 1, 2005).

Dumer "Concatenated Codes and Their Multilevel Generalizations," Total 67 pages (Jan. 1998).

Fan et al., "Comments on and Corrections to On the Equivalence of Generalized Concatenated Codes and Generalized Error Location Codes," IEEE Transactions on Information Theory, vol. 63, No. 8, pp. 5437-5439, Institute of Electrical and Electronics Engineers, New York, New York (Aug. 2017).

Gopalan et al., "On the Locality of Codeword Symbols," IEEE Transactions on Information Theory, vol. 58, No. 11, pp. 6925-6934, Institute of Electrical and Electronics Engineers, New York, New York (Nov. 2012).

Tamo et al., "Bounds on Locally Recoverable Codes with Multiple Recovering Sets," 2014 IEEE International Symposium on Information Theory, pp. 691-695, Institute of Electrical and Electronics Engineers, New York, New York (2014).

Wu et al., "Generalized Integrated Interleaved Codes," IEEE Transactions on Information Theory, vol. 63, No. 2, pp. 1102-1119, Institute of Electrical and Electronics Engineers, New York, New York (Feb. 2017).

Zinov'Ev et al. "Generalized Cascade Codes," Math-Net.Ru All Russian mathematical portal, vol. 12, No. 1, Total 12 pages (1976). With an English translation of the Introduction.

Blokh et al., "Coding of Generalized Concatenated Codes," Math-Net.Ru All Russian mathematical portal, vol. 10, No. 3, Total 8 pages (1974). With an English translation of the Introduction.

* cited by examiner

Braided block codes

CI-BCH

Staircase

SPATIALLY COUPLED FORWARD ERROR CORRECTION ENCODING METHOD AND DEVICE USING GENERALIZED ERROR LOCATING CODES AS COMPONENT CODES

CROSS-REFERENCE TO RELATED APPLICATIONS

This application is a continuation of International Application No. PCT/RU2019/000942, filed on Dec. 13, 2019, the disclosure of which is hereby incorporated by reference in its entirety.

TECHNICAL FIELD

The present disclosure relates to a forward error correction (FEC) coding method in a digital communication system, in particular, to an encoding/decoding method for low-latency, high-throughput, high-rate optical communications. To this end, the present disclosure proposes an encoding device, a decoding device, and corresponding methods.

BACKGROUND

The evolution of digital communication systems is tightly bounded with increasing a data rate in communication channels. This inevitably causes increasing a number of transmission errors. The error correcting coding is aimed at minimizing this number.

The synthesis of error correcting codes for modern data transmission systems is a challenging task, because it is necessary to provide high performance, low latency and low power consumption together.

At the moment, one of the best known FEC codes suitable for high-performance, high-rate applications is based on the idea of spatial coupling or continuously interleaving. Spatial coupling is a very general concept. In the realm of coding, spatial coupling or continuously interleaving of an ensemble of block codes is a principle for error/erasure correction in data communication and data storage. It helps to design a semi-infinite sequence of code symbols, such that any code symbol of the sequence is contained in at least one finite sub-sequence that forms a codeword of some code from the ensemble.

FIG. 1 shows some spatially coupled error-correcting codes (SC ECC), such as Continuously-Interleaved Bose-Chaudhuri-Hocquenghem (CI-BCH) codes, Braided Block Codes and Staircase. These error-correction codes achieve high performance with a low decoding complexity. Usually, binary BCH codes with a small error correction capability are used as component codes of spatially coupled codes in order to get a low-complexity decoding procedure. SC ECC is suitable for high-throughput optical communications (e.g. 400 Gb/s), due to a high paralyzed decoding technique. However, existing code constructions of SC ECC have limitations in their characteristics. Existing techniques for error-floor mitigation are very limited. It is hard to design very low-latency and high-rate conventional SC ECC. Techniques are limited to design low-latency spatially coupled ECC with very low error-floor (for example, less than 1e-15 of output Bit Error Rate (BER)).

Hence, an improved design of a spatially coupled FEC code is desired.

SUMMARY

In view of the above-mentioned limitations, embodiments of the present disclosure aim at improving the conventional FEC coding methods. An objective is to provide an encoding device, a decoding device, and corresponding methods, which implement improved FEC coding. In particular, a goal is to design suitable spatially coupled codes that allow for very low-latency, high-throughput, high-rate applications with a low-complexity decoding procedure, and a low error-floor level.

The objective is achieved by the embodiments provided in the enclosed independent claims. Advantageous implementations of the embodiments of the present disclosure are further defined in the dependent claims.

A first aspect of the present disclosure provides an encoding device, the encoding device being configured to encode a stream of data symbols using a spatially coupled code, wherein at least one generalized error location, GEL, code is used as a component code of the spatially coupled code.

In general, the spatially coupled codewords share symbols with previously formed codewords and subsequently formed codewords. According to embodiments of the present disclosure, codewords used to encode the stream of data symbols are formed using the GEL code. The structure of the GEL code may be as shown in FIG. 4.

Using at least one GEL code as a component code of the spatially coupled code enables a very low-latency, high-throughput, and high-rate application with a low-complexity decoding procedure. It allows to design FEC codes with a low error-floor level. Thus, an improved encoding device, which implements an improved spatially coupled coding method, is obtained.

In an embodiment of the first aspect, the encoding device is further configured to: map the stream of data symbols into a sequence of blocks of symbols, wherein each block of symbols comprises L symbols, L being a positive integer, and a number of data symbols among the L symbols in each block of symbols is less than or equal to L; and form a plurality of codewords of the at least one GEL code using one or more symbols of a first block $B_i$ and one or more symbols of one or more second blocks $B_j$, wherein i is a positive integer, and j is a positive integer less than i.

Optionally, the stream of data symbols may be split into the sequence of blocks of the same size, i.e., the length L, and blocks may be enumerated with positive integers. Possibly, one or more blocks of symbols may not be fully filled with data symbols of the stream of data symbols. Optionally, the codewords of the GEL code may be formed using data symbols from the first block $B_i$ and symbols from one or more previous blocks of the first block $B_i$, e.g., block $B_{i-1}$, ... block $B_{i-m}$, m being a positive integer less than i.

In an embodiment of the first aspect, each codeword of the at least one GEL code comprises information symbols and check symbols, and a code length of each codeword of the at least one GEL code is less than or equal to M, M being a positive integer.

In general, a codeword of the at least one GEL code may thus comprise two parts: one part includes information symbols, and the other part includes check symbols.

In an embodiment of the first aspect, the encoding device is further configured to: generate the check symbols of each codeword of the at least one GEL code by using the one or more data symbols of the first block $B_i$ and the one or more symbols of the one or more second blocks $B_j$, where j<i; and store the generated check symbols of each codeword of the at least one GEL code in the first block $B_i$, wherein a total number of the generated check symbols and data symbols in the first block $B_i$ is equal to L.

In an embodiment of the first aspect, the encoding device is further configured to use one or more symbols of the first block $B_i$ and all the chosen symbols from the other blocks of the sequence of blocks as information symbols for at least one codeword of the at least one GEL code.

In an embodiment of the first aspect, all symbols of the first block $B_i$ and the one or more symbols of the one or more second blocks $B_j$ are represented as an n by N matrix, wherein n and N are each a positive integer, and j is a positive integer less than i.

In an embodiment of the first aspect, the plurality of codewords of each GEL code are represented as a matrix with n rows and a number of columns less than or equal to N.

In an embodiment of the first aspect, a sum of lengths of all codewords of the plurality of codewords of the at least one GEL code is equal to n*N.

In an embodiment of the first aspect, the encoding device is further configured to divide each first block $B_i$ into a number s of m by m matrices, wherein each first block $B_i$ is represented as a (s*m) by m matrix, where s and m are positive integers.

In an embodiment of the first aspect, the plurality of codewords of the at least one GEL code are represented as a (2*s*m) by m matrix.

In an embodiment of the first aspect, the encoding device is further configured to obtain at least one codeword of the plurality of codewords of the at least one GEL code based on the following m by m matrices:

(i−f(i,1), p(i,1)), (i−f(i,2), p(i,2)), . . . , (i−f(i,s), p(i,s)), (i,1), (i,2), . . . , (i,s), where f(x,y) is an integer valued function and p(x,y) is a permutation function for any x, where f(i,1)>f(i,2)> . . . >f(i,s)>0 for any positive integer i, x and y are positive integers, and a value domain of the integer valued function p(x,y) is {1,2, . . . s}.

In an embodiment of the first aspect, each symbol of the first block $B_i$ is used as either an information symbol or a check symbol for a respective codeword of the at least one GEL code.

A second aspect of the present disclosure provides a decoding device, the decoding device being configured to decode a sequence of encoded symbol blocks using a spatially coupled code, wherein at least one generalized error location, GEL, code is used as a component code of the spatially coupled code.

Before data is sent, a sending device, e.g. the encoding device as provided in the first aspect or any embodiment of the first aspect, encodes data by using a GEL code as a component code in spatially coupled constructions, according to embodiments of the present disclosure. After the data is received, a receiving device, e.g. the decoding device as provided in the second aspect, decodes the data by using the same spatially coupled GEL code. Notably, the sending device and the receiving device may first agree on a spatially coupled GEL codeword structure encoding manner. Alternatively, before receiving data sent by the sending device, the receiving device may first obtain the spatially coupled GEL codeword structure encoding manner of the sending device.

Using at least one GEL code as a component code of the spatially coupled code enables a very low-latency, high-throughput, and high-rate application with a low-complexity decoding procedure. It allows to design FEC codes with a low error-floor. Thus, an improved decoding device is obtained.

A third aspect of the present disclosure provides an encoding method, comprising encoding a stream of data symbols using a spatially coupled code, wherein at least one generalized error location, GEL, code is used as a component code of the spatially coupled code.

The encoding method of the third aspect can be provided with similar embodiments as the encoding device of the first aspect. Accordingly, the encoding method of the third aspect and its embodiments provide the same advantages and effects as described above for the encoding device of the first aspect and its respective embodiments.

A fourth aspect of the present disclosure provides a decoding method, comprising decoding a sequence of encoded symbol blocks using a spatially coupled code, wherein at least one GEL code is used as a component code of the spatially coupled code.

The decoding method of the fourth aspect can be provided with similar embodiments as the decoding device of the second aspect. Accordingly, the decoding method of the fourth aspect and its embodiments provide the same advantages and effects as described above for the decoding device of the second aspect and its respective embodiments.

A fifth aspect of the present disclosure provides a computer program product comprising a program code for carrying out, when implemented on a processor, a method according to the first aspect and its embodiments, or the second aspect and its embodiments.

It has to be noted that all devices, elements, units and means described in the present application could be implemented in the software or hardware elements or any kind of combination thereof. All steps which are performed by the various entities described in the present application as well as the functionalities described to be performed by the various entities are intended to mean that the respective entity is adapted to or configured to perform the respective steps and functionalities. Even if, in the following description of specific embodiments, a specific functionality or step to be performed by external entities is not reflected in the description of a specific detailed element of that entity which performs that specific step or functionality, it should be clear for a skilled person that these methods and functionalities can be implemented in respective software or hardware elements, or any kind of combination thereof.

BRIEF DESCRIPTION OF DRAWINGS

The above described aspects and embodiments of the present disclosure will be explained in the following description of specific embodiments in relation to the enclosed drawings, in which.

DETAILED DESCRIPTION OF EMBODIMENTS

Illustrative embodiments of encoding/decoding method, encoding/decoding device, and computer program product are described with reference to the figures. Although this description provides a detailed example of possible implementations, it should be noted that the details are intended to be exemplary and in no way limit the scope of the application.

Moreover, an embodiment/example may refer to other embodiments/examples. For example, any description including but not limited to terminology, element, process, explanation and/or technical advantage mentioned in one embodiment/example is applicative to the other embodiments/examples.

Figure 1:
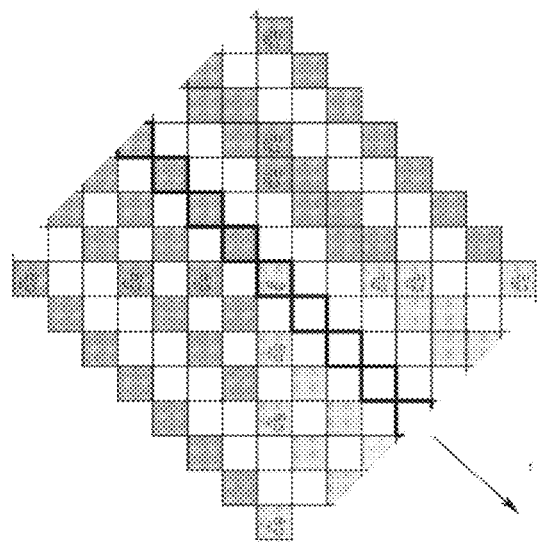
FIG. 1 shows examples of spatially coupled code constructions.
Figure 1:
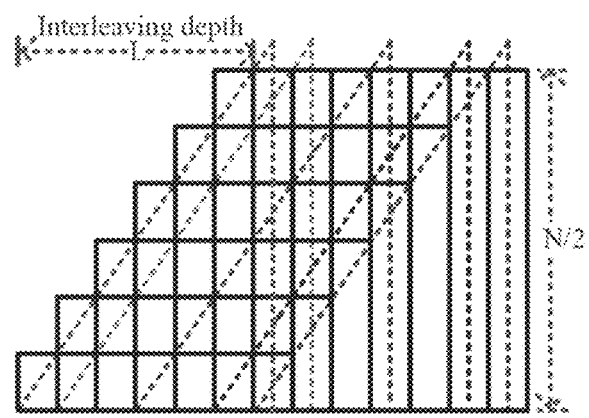
Figure 1:
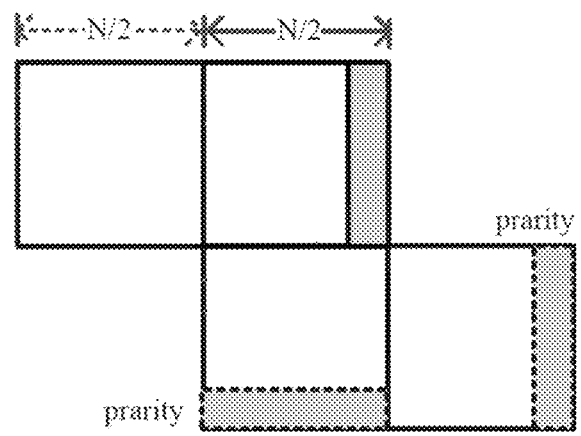
Figure 2:
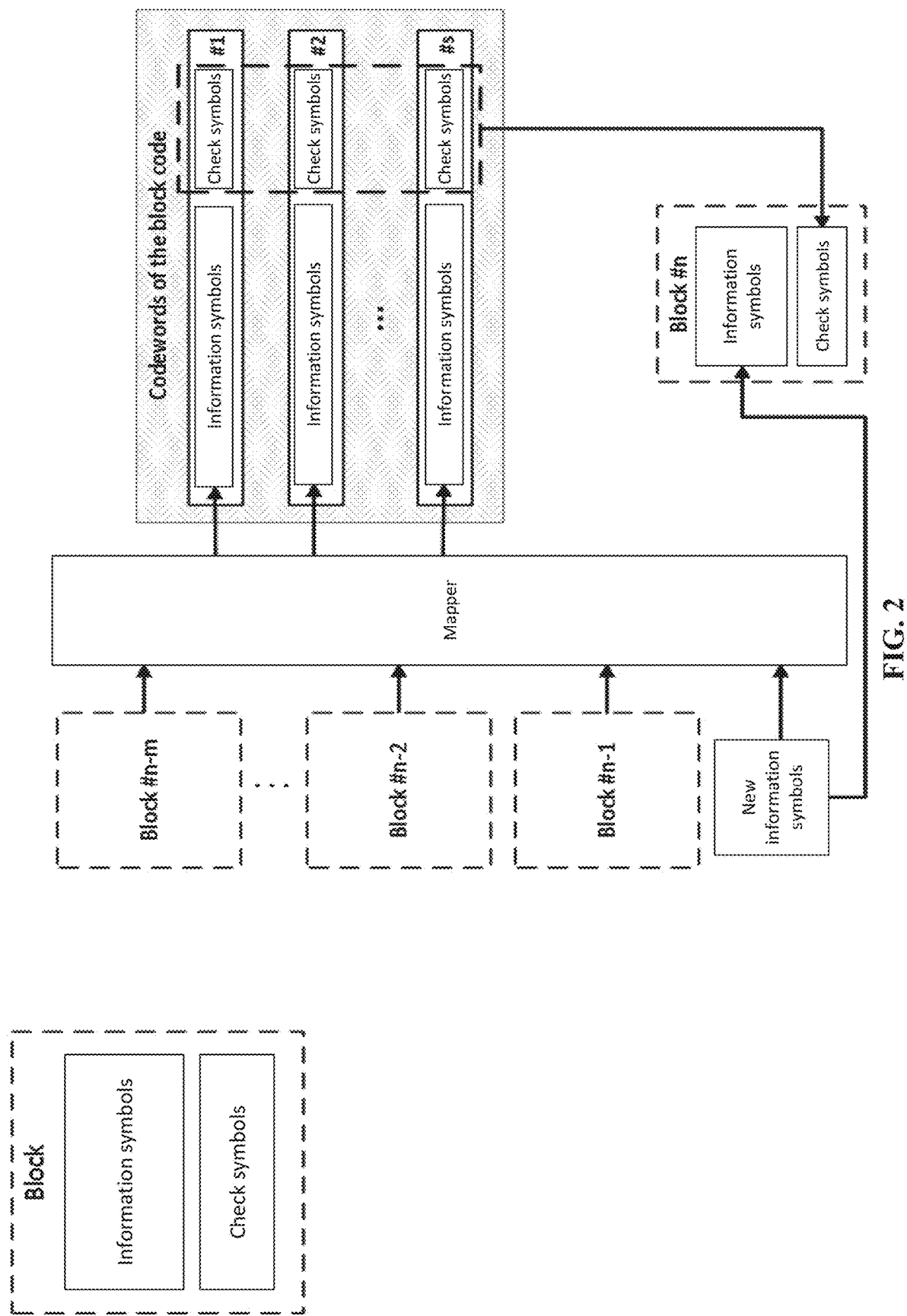
FIG. 2 shows a scheme for spatial coupling of a block code.

FIG. 2 shows a scheme for spatial coupling of a block code. Data is transmitted by frames. Each frame consists of information symbols and parity check symbols. New portions of information symbols are put to a new frame. The frame's parity check symbols are parity check symbols of the codeword of the GEL code. The codeword of the GEL code can be obtained by GEL code's encoding procedure. Information symbols for encoding procedure of the GEL code are chosen from symbols of some previous frames and information symbols of new frame.

In particular, a spatially coupled code can be constructed by means of the following procedure: data is divided in blocks, wherein each block consists of information symbols and check symbols; new information symbols are put down into the new block; check symbols for the new block are obtained from some symbols of previous blocks and new information symbols by the encoding procedure of a block code.

The main parts of the scheme are the block code and the mapper. For example, the input of the mapper for Staircase and Braided Block codes, e.g. Block-wise Braided Block codes, is new information symbols and all symbols of the previous block. The difference of these types of codes consists in the inner structure of the mapper.

The principle of spatial coupling is not restricted to the scheme presented in FIG. 2. It can be considered to implement more than one block code and more than one mapper. Check symbols of a block may depend on different numbers of previous blocks depending on the index of the block. Some padding by zero or non-zero symbols can also be used.

Figure 3:
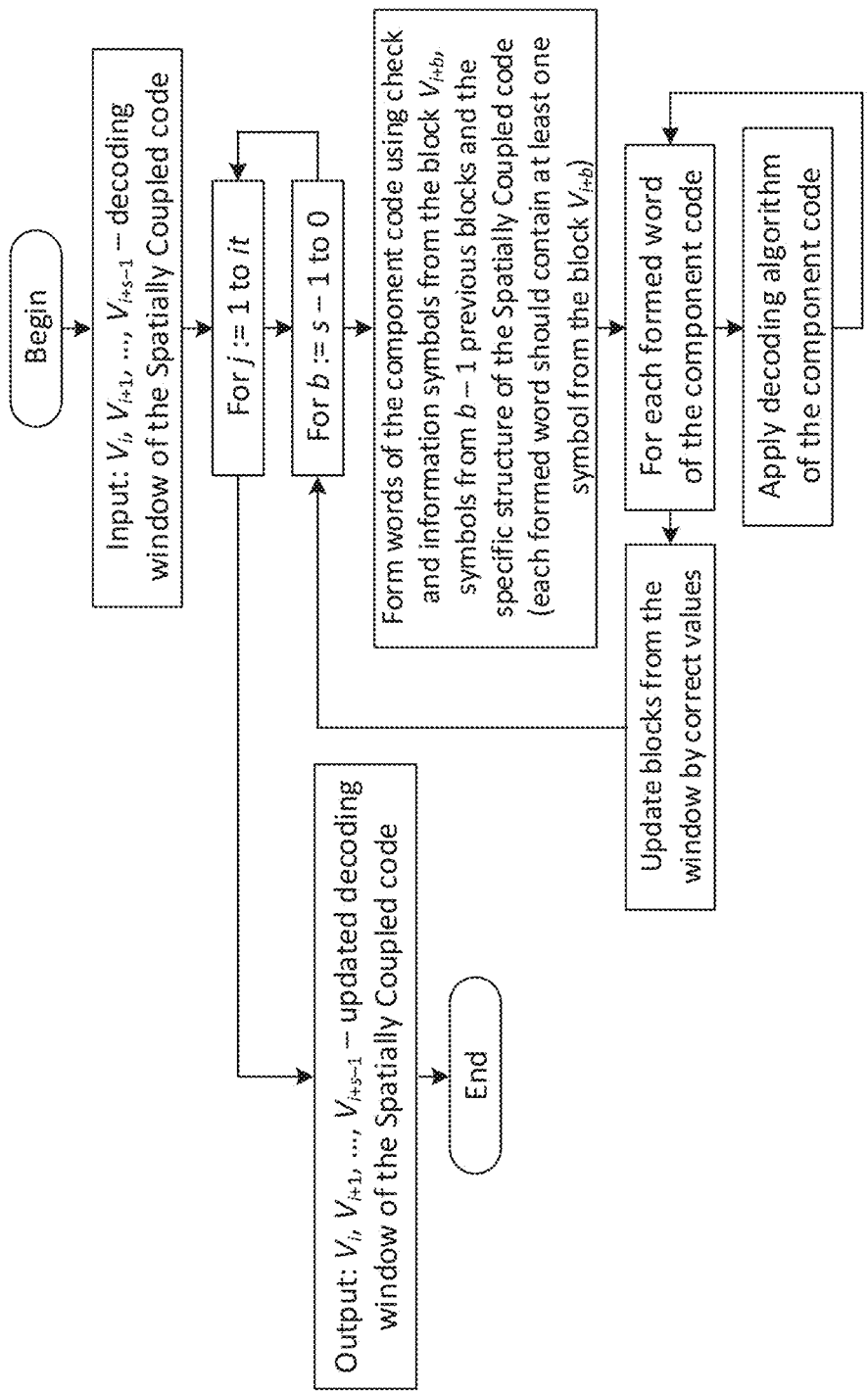
FIG. 3 shows a decoding procedure of sliding window decoding for spatially coupled codes.

Decoding of a spatially coupled code is performed using a "sliding window" decoding technique. Namely, a receiver collects s subsequent blocks of symbols $V_i, V_{i+1}, \ldots, V_{i+s-1}$ (window) from the channel and/or from previous processing. Then, decoding steps of the sliding window are applied, as shown in FIG. 3. Hereafter, the window "shifts" and the decoder utilizes the following blocks $V_{i+1}, V_{i+2}, \ldots, V_{i+s}$ only.

FIG. 3 shows a decoding procedure of sliding window decoding for spatially coupled codes.

Existing spatially coupled code constructions have limitations in their characteristics.

For example, let us consider Staircase codes with an overhead OH=6.67%. One can show it is impossible to construct Staircase codes with quite a low latency, good performance and low error floor: codes based on BCH correcting 2 errors have low latency, but high error floor. Some additional error floor mitigation technique is required, and, even after that, the error floor is near 1e-15. Conversely, codes based on BCH correcting 3 errors have a good performance, but the latency is unacceptably high (as shown in Table 1). So, there is no code "in between", applicable for both low-latency and high-performance cases, and, at the same time, having a low error floor and a relatively simple decoding algorithm.

TABLE 1

Performance of Staircase with different latencies and OH=6.67%

| Staircase (t = 3) | | | Staircase (t = 2) | | |
|---|---|---|---|---|---|
| Latency, bits | Performance | Error floor | Latency, bits | Performance | Error floor |
| 2.09M | ≈4.7e−3 | ≈4e−22 | Performance saturation | | |
| 1.83M | ≈4.5e−3 | ≈2e−22 | | | |
| 1.57M | ≈3.8e−3 | ≈1e−23 | 1.59M | ≈4.15e−3 | ~1e−15 |
| Not applicable due to short decoding window | | | 1.47M | ≈4.10e−3 | ~1e−15 |
| | | | 1.35M | ≈4.05e−3 | ~1e−15 |
| | | | 1.23M | ≈3.95e−3 | ~1e−15 |

Figure 4:
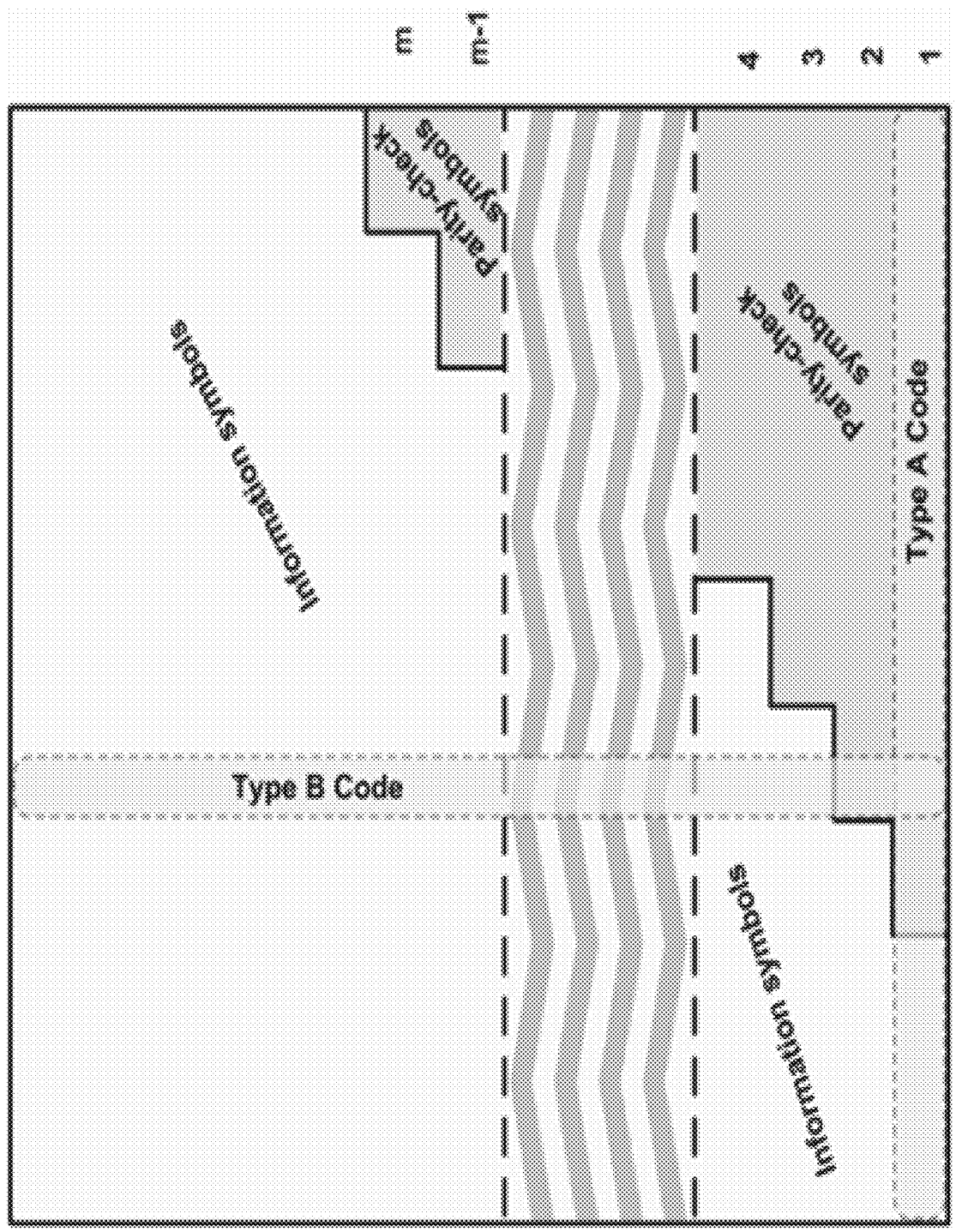
FIG. 4 shows an example of generalized error location, GEL, codes.

A class of block codes, generalized error location, GEL, codes, is shown in FIG. 4. Generally, the GEL codeword structure includes a row code and a column code, and a check code of the GEL code is obtained by performing an encoding operation on a parity bit of the column code by using the row code. The row code may be also referred to as outer code, and the column code may be also referred to as inner code.

Let $\mathbb{F}_q$ be a finite field with q elements. Let $C_i^{in}$ be a [n, $k_i$, $d_i]_q$ linear code for $i \in \{0, 1, \ldots, L\}$ such that $\mathbb{F}_q^n = C_0^{in} \supset C_1^{in} \supset \ldots \supset C_L^{in} = \{0\}$, where 0 is a zero vector of length n. Thus, we have $n=k_0>k_1> \ldots >k_L=0$. Let Hc be a non-singular matrix over $\mathbb{F}_q$ of the form:

$$H_C = \begin{pmatrix} H_L \\ H_{L-1} \\ \vdots \\ H_1 \end{pmatrix} \quad (1)$$

where $H_i$ is a $m_i \times n$ sub-matrix and $m_i = k_{i-1} - k_i$ for $i \in \{1, 2, \ldots, L\}$; besides, matrices $H_i, H_{i-1}, \ldots, H_1$ form a parity-check matrix of $C_i^{in}$.

Let $C_i^{out}$ be a [N, $K_i$, $D_i]_{Q_i}$ linear code over $\mathbb{F}_{Q_i}$ for $i \in \{1, 2, \ldots, L\}$, where $Q_i = q^{m_i}$. Linear sub-space C of n×N matrices over $\mathbb{F}_q$ is called GEL code with the component L+1 inner codes $C_0^{in}, C_1^{in}, \ldots, C_L^{in}$ and L outer codes $C_1^{out}, C_2^{out}, \ldots, C_L^{out}$ respectively, if C satisfies the following condition:

$$H_i \cdot c \in C_i^{out}, \forall c \in C \forall i \in \{1, 2, \ldots, L\}, \quad (2)$$

in respect to any isomorphism from $\mathbb{F}_q^{s \times N}$ to $\mathbb{F}_{q^s}^N$ (from a vector space of all s×N matrices over $\mathbb{F}_q$ to a vector space of dimension N over $\mathbb{F}_{q^s}$).

The most general case of this construction is using N different nested inner codes such that $\mathbb{F}_q^n = C_0^{in(j)} \supset C_1^{in(j)} \supset \ldots \supset C_L^{in(j)} = \{0\}$, where $C_i^{in(j)}$ is a $[n, k_i, d_i^{(j)}]_q$ linear code for $i \in \{0, 1, \ldots, L\}$ and $j \in \{1, 2, \ldots, N\}$. In this case, the condition (2) can be modified as follows:

$$(H_i^{(1)} \cdot c^{(1)}, H_i^{(2)} \cdot c^{(2)}, \ldots, H_i^{(N)} \cdot c^{(N)}) \in C_i^{out},$$
$$\forall c \in C \forall i \in \{1, 2, \ldots, L\}, \quad (3)$$

where $H_i^{(j)}$ are corresponding sub-matrices of $H_C^{(j)}$ and $c^{(j)}$ is a j-th column of c for $j \in \{1, 2, \ldots, N\}$.

In particular, a single set of nested inner codes is used in this embodiment. To get a simple method of systematic encoding of GEL codes, systematic encoding of the outer codes and a special form of matrix Hc are utilized, namely:

$$H_C = \begin{pmatrix} I_L & O_{L,L-1} & \ldots & O_{L,2} & O_{L,1} \\ P_{L-1,1} & I_{L-1} & \ldots & O_{L-1,2} & O_{L-1,1} \\ \vdots & \vdots & \ddots & \vdots & \vdots \\ P_{2,1} & P_{2,L-1} & \ldots & I_2 & O_{2,1} \\ P_{1,1} & P_{1,L-1} & \ldots & P_{1,2} & I_1 \end{pmatrix}, \quad (4)$$

Where $I_i$ is a $m_i \times m_i$ identity matrix; $O_{i,j}$ is a $m_i \times m_j$ zero matrix; and $P_{i,j}$ is a $m_i \times m_j$ matrix over $\mathbb{F}_q$.

In accordance with the structure of matrix $H_C$ and parameters of outer codes, a codeword c of the GEL code can be split into 2L sub-matrices of size $m_i \times K_i$ or $m_i \times (N-K_i)$ for $i \in \{1, 2, \ldots, L\}$ as follows:

$$c = \begin{pmatrix} X_L & Y_L \\ X_{L-1} & Y_{L-1} \\ \vdots & \vdots \\ X_1 & Y_1 \end{pmatrix}, \quad (5)$$

Where $X_i$ and $Y_i$ are $m_i \times K_i$ and $m_i \times (N-K_i)$ sub-matrices respectively for $i \in \{1, 2, \ldots, L\}$.

Figure 5:
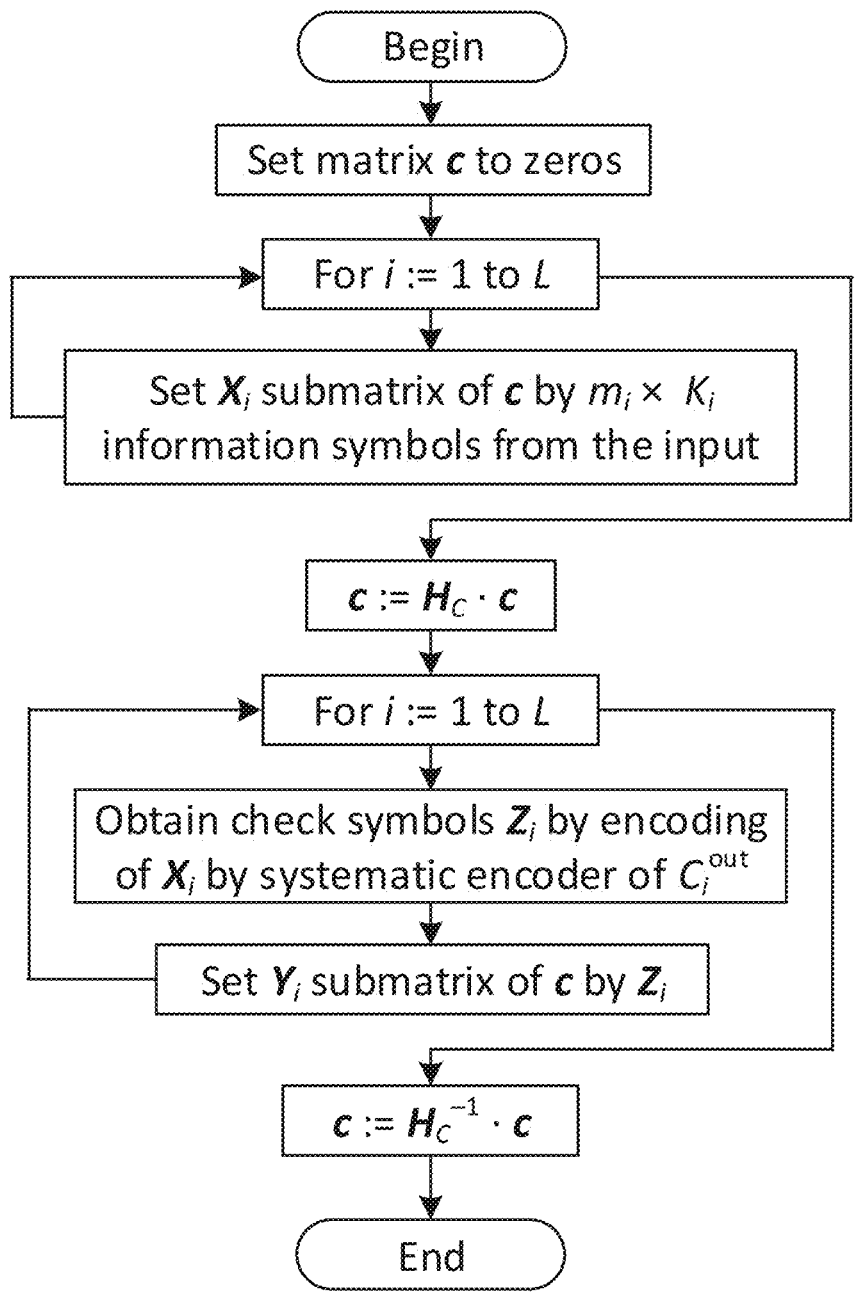
FIG. 5 shows a GEL code encoding procedure.
Figure 6:
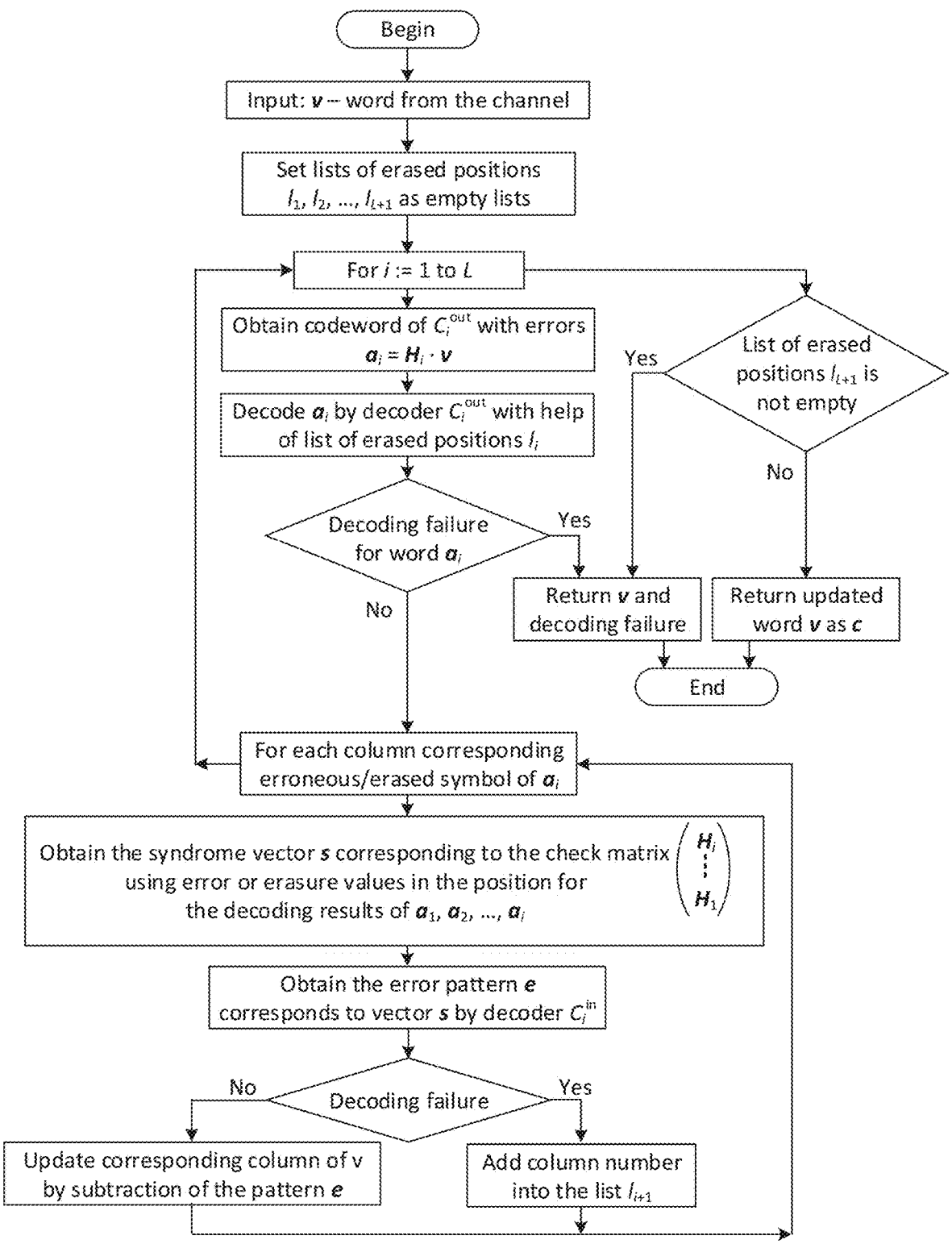
FIG. 6 shows a decoding procedure of a GEL code.

FIG. 5 represents flow chart of a possible GEL encoding procedure.
Input: $\Sigma_{i=1}^L m_i \cdot K_i$ values over $\mathbb{F}_q$ (the values are considered as information symbols)
Output: c—codeword of GEL code (n×N matrix over $\mathbb{F}_q$)
 1: Set matrix c by zeroes
 2: For i:=1 to L do
 3: Set $X_i$ sub-matrix of c by $m_i \times K_i$ information symbols from the input
 4: end For
 5: $c := H_B \cdot c$
 6: For i:=1 to L do
 7: Obtain check symbols $Z_i$ by encoding of $X_i$ by systematic encoder of $A_i$
 8: Set $Y_i$ sub-matrix of c by $Z_i$
 9: end For
 10: $c := H_B^{-1} \cdot c$
   where the matrix $H_B^{-1}$ is a standard matrix inverse of $H_B$ FIG. 6 shows a flow chart of a possible decoding procedure of a GEL code.
Input: v—word from the channel
Output: c—codeword of the GEL code or updated word v and the decoding failure signal
 1: Set lists of erased positions $l_1, l_2, \ldots, l_{L+1}$ as empty list
 2: For i:=1 to L do
 3: Obtain codeword of $A_i$ with errors $a_i := H_i \cdot v$
 4: Decode of $a_i$ by the decoder of $A_i$ with help of list of erased positions $l_i$
 5: If the decoding failure for the word $a_i$ is observed then finish the decoding and return v and the decoding failure
 6: Otherwise continue decoding
 7: For each column corresponding erroneous or erased symbol of $a_i$
 8: Obtain the syndrome vector s corresponding to the check matrix $$\begin{pmatrix} H_i \\ \vdots \\ H_1 \end{pmatrix}$$

by the use of error or erasure values in the position for the decoding results of $a_1, a_2, \ldots, a_i$
 9: Obtain the error pattern e corresponds to the vectors by the decoder of $B_i$
 10: If the decoding failure is observed then add column number into the list $l_{i+1}$
 11: Otherwise update corresponding column of v by subtraction of the pattern e
 12: end For
 13: end For
 14: If the list of erased positions $l_{L+1}$ is not empty then finish the decoding and return v and the decoding failure
 15: Otherwise return updated word v as c The decoding of the GEL code can be done partially. Indeed, it is possible to perform some iterations of the loop for and update the word v from the channel. It may reduce the number of errors in the word, but not correct all of them. Such strategies may be useful for iterative decoding of spatially coupled codes, where the GEL code is a component code.

Figure 7:
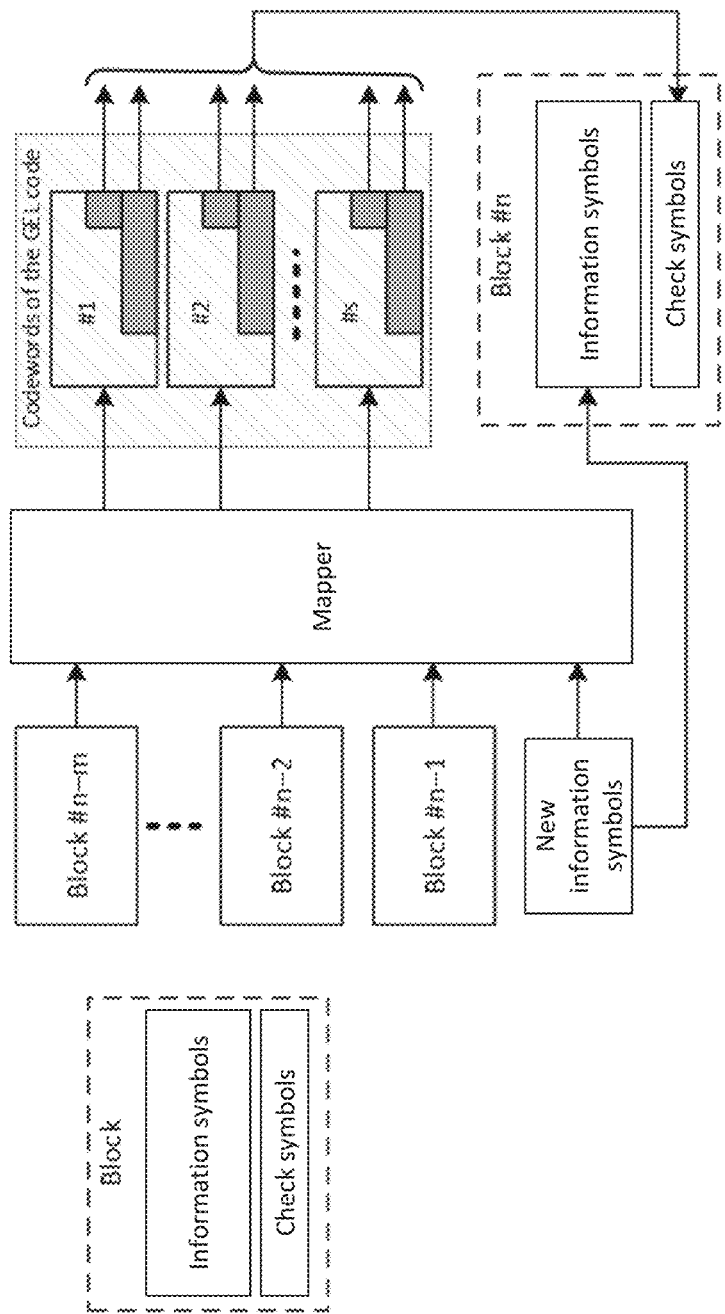
FIG. 7 shows using a GEL code as a component code in a spatially coupled construction according to an embodiment of the present disclosure.

To design long GEL codes with high performance, it is necessary to use outer codes over huge fields, with a large minimum distance. In addition, existing GEL codes do not support iterative decoding. Therefore, this disclosure proposes to use GEL codes as component codes in spatially coupled constructions, as depicted in FIG. 7.

Figure 8:
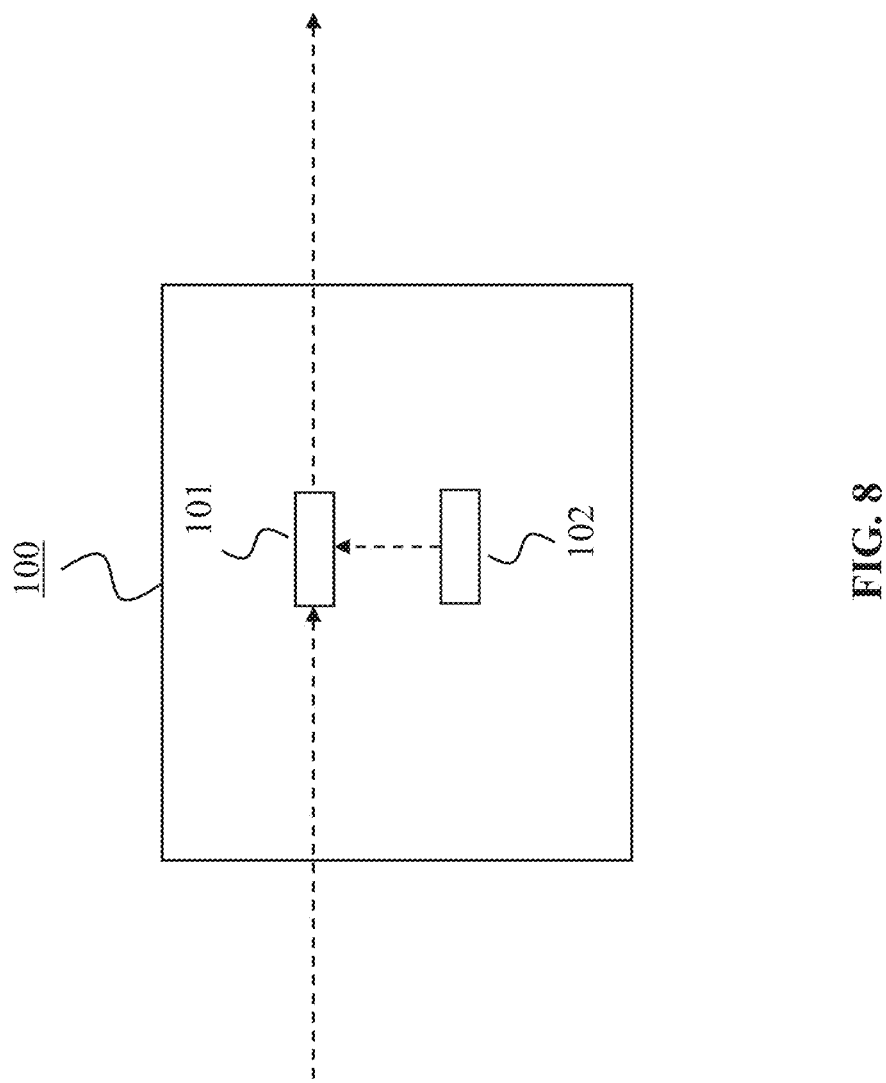
FIG. 8 shows an encoding device according to an embodiment of the present disclosure.

FIG. 8 shows an encoding device 100 according to an embodiment of the present disclosure. The encoding device 100 may comprise processing circuitry (not shown) configured to perform, conduct or initiate the various operations of the encoding device 100 described herein. The processing circuitry may comprise hardware and software. The hardware may comprise analog circuitry or digital circuitry, or both analog and digital circuitry. The digital circuitry may comprise components such as application-specific integrated circuits (ASICs), field-programmable arrays (FPGAs), digital signal processors (DSPs), or multi-purpose processors. In one embodiment, the processing circuitry comprises one or more processors and a non-transitory memory connected to the one or more processors. The non-transitory memory may carry executable program code which, when executed by the one or more processors, causes the encoding device 100 to perform, conduct or initiate the operations or methods described herein.

According to embodiments of the present disclosure, the encoding device 100 is configured to encode a stream of data symbols 101 using a spatially coupled code 102. In particular, at least one GEL code is used as a component code of the spatially coupled code 102.

According to embodiments of the present disclosure, data stream symbols are split in a sequence of blocks of the same size, and blocks are enumerated by positive integers.

Accordingly, the encoding device 100, according to an embodiment of the present disclosure, is further configured to map the stream of data symbols 101 into a sequence of blocks of symbols, wherein each block comprises L symbols, L being a positive integer, and a number of data symbols among L symbols in each block is less than or equal to L. Further, the encoding device 100 is configured to form a plurality of codewords of the at least one GEL code using one or more data symbols of a block $B_i$ and one or more symbols of one or more blocks $B_j$, wherein i is a positive integer, and j is a positive integer less than i.

Codewords of the GEL code are formed using symbols from the block $B_i$ and one or more previous blocks $B_j$. The amount of blocks $B_j$ should not be limited.

Optionally, each codeword of the at least one GEL code comprises information symbols and check symbols, and the code length of each codeword is less than or equal to M, M being a positive integer.

According to an embodiment of the present disclosure, the encoding device 100 may be configured to generate the check symbols of each codeword of the at least one GEL code by using one or more data symbols of the block $B_i$ and one or more symbols of one or more blocks $B_j$, where i and j are both positive integers, and j less than i. The encoding device 100 may be configured to store the generated check symbols of each codeword of the at least one GEL code in the block $B_i$, wherein a total number of the generated check symbols and data symbols in the block $B_i$ is equal to L.

Notably, when the encoding device 100 maps the stream of data symbols 101 into a sequence of blocks of symbols, different amounts of data symbols may be mapped into different blocks. In particular, some blocks may contain reserved spaces for storing check symbols. Accordingly, some blocks may contain L data symbols; some bocks may consist of x number of data symbols and L-x number of check symbols, x being a positive integer less than L.

Optionally, the block $B_i$ consists of information symbols, i.e., data symbols mapped from the stream of data symbols, and check symbols generated by the encoding device 100. In particular, check symbols may be generated based on symbols of the previous blocks of the block $B_i$, and may be generated, additionally, based on check symbols stored in the previous blocks of the block $B_i$.

Optionally, the encoding device 100 may be further configured to use one or more symbols of the block $B_i$ and all the chosen symbols from the other blocks of the sequence of blocks as information symbols for at least one codeword of the at least one GEL code.

Therefore, after the stream of data symbols is split and blocks are enumerated, let all data symbols of the block $B_i$ and some symbols from blocks $B_j$, where i and j are both positive integers, and j less than i, be represented as single block of length K, K being a positive integer. Let a code length of each GEL code from the plurality of GEL codes be at most K. The check symbols of each code from the plurality of GEL codes are generated with the help of symbols from the representation of blocks $B_j$ as single block of length K, where j at most i, wherein at least some symbols of the block $B_i$ and all chosen symbols from other blocks are used as information symbols at least for one GEL code. And the generated check symbols are stored in the block $B_i$.

In another embodiment of the present disclosure, all data symbols of the block $B_i$ and the one or more symbols of one or more block $B_j$ can be represented as an n by N matrix, n and N being positive integers. Optionally, the plurality of codewords of each GEL code may be represented as a matrix with n rows and a number of columns less than or equal to N. According to an embodiment of the present disclosure, a sum of lengths of all codewords of the plurality of codewords of each GEL code may be equal to n*N.

Notably, the check symbols of each code from the plurality of GEL codes may be generated with the help of symbols from the representation of blocks $B_j$ as an n by N matrix, where j at most i, wherein at least some symbols of the block $B_i$ and all chosen symbols from other blocks are used as information symbols at least for one GEL code. Similarly as previously described embodiments, the generated check symbols are stored in the block $B_i$.

Optionally, each symbol of block $B_i$ may be either an information or check symbol for at least one GEL code from the plurality of GEL codes. Alternatively, each symbol of block $B_i$ may be either an information or check symbol for exactly one GEL code from the plurality of GEL codes.

According to an embodiment of the present disclosure, each block $B_i$ may be represented as a (s*m) by m matrix, wherein each block $B_i$ is divided into a number s of m by m matrix, wherein s and m are both positive integers. In particular, the j-th m by m matrix from the block $B_i$ is denoted by (i, j) where j is a positive integer less than or equal to s.

In other words, let each block be a (s*m) by m matrix, fix enumeration of m by m matrices inside the block. The j-th m by m matrix from i-th block is denoted by (i, j) for any positive integers i and j, where j at most s.

Optionally, the plurality of codewords of the at least one GEL code are represented as a (2*s*m) by m matrix.

According to an embodiment of the present disclosure, the encoding device 100 may be configured to obtain the codeword of the at least one GEL code from the following m by m matrices:

(i−f(i,1),p(i,1)),(i−f(i,2),p(i,2)), . . . ,(i−f(i,s),p(i,s)),(i, 1),(i,2), . . . (i,s), where f(x,y) is an integer valued function and p(x,y) is a permutation function for any x, where f(i,1)>f(i,2)> . . . >f(i,s)>0 for any positive integer i, and a value domain of the function p(x,y) is {1,2, . . . s}.

Optionally, the check symbols of the GEL code may be generated with the help of (2*s*m) by m matrix representation, wherein all symbols from matrices (i−f(i,1), p(i,1)), (i−f(i,2), p(i,2)), . . . , (i−f(i,s), p(i,s)) and at least some symbols from matrices (i,1), (i,2), . . . (i,s) are used as information symbols. Similarly as previously described embodiments, the generated check symbols are stored in the block $B_i$. Optionally, all symbols from the representation as (2*s*m) by m matrix are used once as either information or check symbols.

Further, let (2*s*m) by m matrix be obtained as follows: from top to bottom, one by one, the matrix transpose of (i−f(i,1), p(i,1)), (i−f(i,2), p(i,2)), . . . , (i−f(i,$), p(i,s)) is filled and then, one by one, matrices: (i,1), (i,2), . . . (i,s), i.e., (i−f(i,1),p(i,1))$^T$ (i−f(i,2),p(i,2))$^T$

. . .

(i−f(i,s),p(i,s))$^T$ (i,1)

(i,2)

. . .

(i,s)

Let function $f(x,y)=f_0(y)$ for each even x and $f(x,y)=f_1(y)$ for each odd x, where functions $f_0(y)$ and $f_1(y)$ are positive integer functions such that $f_0(1)>f_0(2)> \ldots >f_0(s)>0$ and $f_1(1)>f_1(2)> \ldots >f_1(s)>0$. Let function $p(x,y)$ be a reverse permutation, namely $p(x,y)=s+1-y$ for any positive integer x and y from $\{1,2,\ldots,s\}$. Lets be 1, functions $f_0(y)$, $f_1(y)$ be equal and $f_0(1)=f_1(1)=1$. In this way, a Staircase type of a spatial coupled design can be obtained.

Figure 9:
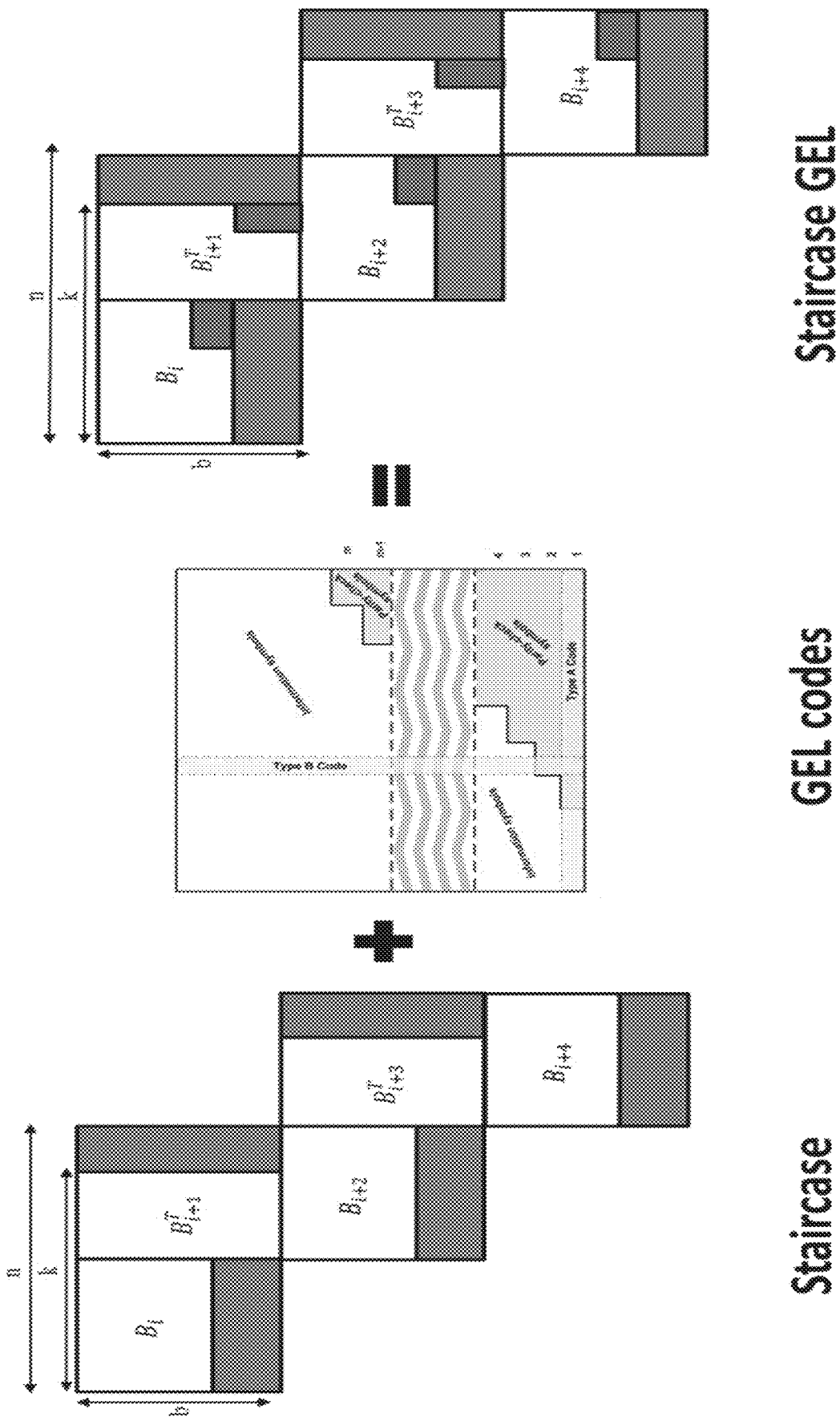
FIG. 9 shows using GEL codes as a component code in a Staircase construction according to an embodiment of the present disclosure.

A Staircase construction with GEL component codes according to an embodiment of the present disclosure is shown in FIG. 9.

Specific embodiments using the Staircase type of spatially coupled and single block code—GEL code are described below.

Embodiment 1

Let GEL code C be a linear binary code of length 57800 and dimension 55866 constructed by 4 inner and 3 outer codes. A codeword c of the code C can be considered as 340 by 170 matrix bits.

Let 3 out of 4 inner codes of GEL code C be narrow-sense primitive shortened binary BCH codes of length 340 and one zero code. Namely, $C_0^{in}$ is a $[340, 340,1]_2$ code with a generator polynomial $g_0(x)=1$, $C_1^{in}$ is a $[340, 330,4]_2$ code with a generator polynomial:

$$g_1(x)=g_0(x)\cdot(x^9+x^4+1)\cdot(x+1)=x^{10}+x^9+x^5+x^4+x+1,$$

$C_2^{in}$ is $[340,321,6]_2$ code with a generator polynomial:

$$g_2(x)=g_1(x)\cdot(x^9+x^6x^4+x^3+1)=x^{19}+x^{18}+x^{16}+x^{15}+x^{13}+x^{12}+x^{11}+x^{10}+x^9+x^6+x^4+x^3+x+1, \text{ and}$$

$B_3$ is a binary zero code of length 340.

Let a check matrix $H_C$ be in the form (4) as discussed above, namely:

$$H_C = \begin{pmatrix} H_3 \\ H_2 \\ H_1 \end{pmatrix} = \begin{pmatrix} I_3 & O_{3,2} & O_{3,1} \\ P_{2,1} & I_2 & O_{2,1} \\ P_{1,1} & P_{1,2} & I_1 \end{pmatrix}, \quad (6)$$

Therefore, we have $m_1=10$, $m_2=9$, $m_3=321$.

Let outer codes of GEL code C consider 3 codes of length 170 over different extensions of binary field. Namely, $C_1^{out}$ is a zero code over GF(1024), $C_2^{out}$ is a $[170,144,27]_{2^9}$ cyclic Reed-Solomon code over GF(512) with a generator polynomial $g(x)=\Pi_{i=0}^{25}(x-\alpha^i)$, where $\alpha$ is a primitive element of GF(512), and the last one $C_2^{out}$ is $[170,170,1]_{2^{321}}$ identical code over GF($2^{321}$). $C_2^{out}$ can be used as an error-correction code and, for that code, some non-trivial encoding and decoding procedures are needed. So, $C_1^{out}$ and $C_3^{out}$ codes are needed just for formal description reason.

Herein, each column of the codeword c of the GEL code is a codeword of $C_1^{in}$ code by the construction. Moreover, the matrix multiplication of $H_2$ and c is a codeword of RS code $C_2^{out}$.

The decoding of the C code can be split in 3 steps:
1. Decoding columns by a decoder of $C_1^{in}$;
2. Obtaining word for $C_2^{out}$ by matrix multiplication of $H_2$ and c and then decoding the word by a decoder of $C_2^{out}$;
3. Decoding some columns by a syndrome decoder of $C_2^{in}$ with the use of the decoding results of previous steps.

Notably, a decoding failure for a column of the first decoding step can be used as a signal to erase for the same symbol number as the column number to $C_2^{out}$ decoding of the second decoding step. Error and/or erasure values in $C_2^{out}$ decoding are syndrome values for the column in respect to $H_2$ parity-check matrix. Since matrices $H_2$ and $H_1$ form the parity-check matrix for $C_2^{in}$ code, it is possible to use syndrome values calculated using these matrices in the first and second decoding steps presented above for decoding the column by the syndrome decoder of $C_2^{in}$.

Let spatially coupled based on staircase like design and single block (component) GEL code C. That means, we consider a semi-infinite sequence $\mathcal{B} = \{B_i\}_{i=1}^{\infty}$ of 170×170 binary matrices such that:
1. The matrix $B_1$ is a zero matrix;
2. The matrix $$\begin{pmatrix} B_{i-1}^T \\ B_i \end{pmatrix}$$

is a codeword of the code C for positive integer i greater than 1;
where $B^T$ is the matrix transpose of B.

The encoding of this semi-infinite sequence is successive encoding matrix by matrix with the use of the encoding procedure for the code C. Namely, we use matrix $B_{i-1}^T$ and 26966 bits of the payload as information bits of the codeword, and then obtain 1934 parity bits. The payload bits and obtained parity bits can form the matrix $B_i$.

Embodiment 2

Embodiment 2 is based on Embodiment 1.

Reed-Solomon $[544,514,31]_{1024}$ code is used in different standards, and also known as KP4 code. Let $\hat{C}$ be a $[537, 514,25]_{1024}$ code obtained by puncturing of KP4 at last 7 check symbols.

Consider the concatenation of $\hat{C}$ and the spatially coupled code described in the Embodiment 1. This code can be considered as semi-finite sequence $\mathcal{B} = \{B_i\}_{i=1}^{\infty}$ of 170×170 binary matrices. Each block $B_i$ consists of 26966 information bits and 1934 parity bits. Encoding of the code under consideration can be done in two steps: first, form 5 codewords of $\hat{C}$ and fill their binary image in information bits of $B_i$, the rest 116 bits is filled by zeroes; second, obtain 1934 parity bits as in the Embodiment 1. There is no need to transmit 116 zero information bits through the channel. The positions of the missing 116 zeroes in information bits of blocks of the code are known for the receiver.

Embodiment 3

Let GEL code C be a linear code of length 2646 and dimension 2573 over GF(128) constructed by 4 inner and 3 outer codes. A codeword c of the code C can be considered as a 126 by 21 matrix over GF(128).

Let 2 out of 4 inner codes of GEL code C be Reed-Solomon code of length 126 over GF(128) and let the others be identical and zero codes. Namely, $C_0^{in}$ is $[126, 126,1]_{128}$ identical code or cyclic code with the generator polynomial $g_0(x)=1$; $C_1^{in}$ is a $[126, 125,4]_{128}$ cyclic Reed-Solomon code with the generator polynomial $g_1(x)=g_0(x)\cdot\Pi_{i=0}^{2}(x-\alpha^i)$; $C_2^{in}$ is a $[126,124,5]_{128}$ cyclic Reed-Solomon code with the generator polynomial $g_2(x)=g_1(x)\cdot(x-\alpha^3)=\Pi_{i=0}^{3}(x-\alpha^i)$; and $C_3^{in}$ is the zero code of length 126 over GF(128), where $\alpha$ is a primitive element of GF(128).

Let outer codes of the GEL be codes of length 21 over different extensions of GF(128). Namely, $C_1^{out}$ is a zero code over GF($128^3$), $C_2^{out}$ is a $[21,11,11]_{128}$ cyclic Reed-Solomon code over GF(128) with the generator polynomial $g(x)=\Pi_{i=0}^{9}(x-\alpha^i)$, where $\alpha$ is primitive element of GF(128), and the last one $C_3^{out}$ is a $[21,21,1]_{128^{122}}$ identical code over GF($128^{122}$). $C_2^{out}$ can be used as an error-correction code and, for that code, some non-trivial encoding and decoding procedures are needed. So, $C_1^{out}$ and $C_3^{out}$ codes are needed just for formal description reason.

Let a check matrix $H_c$ be in the form (4) as discussed above, namely:

$$H_c = \begin{pmatrix} H_3 \\ H_2 \\ H_1 \end{pmatrix} = \begin{pmatrix} I_3 & O_{3,2} & O_{3,1} \\ P_{2,1} & I_2 & O_{2,1} \\ P_{1,1} & P_{1,2} & I_1 \end{pmatrix},$$

Therefore, we have $m_1=3$, $m_2=1$, $m_3=122$.

Herein, each column of a codeword c of the GEL code C is a codeword of $C_1^{in}$ code by the construction. Moreover, the matrix multiplication of $H_2$ and a GEL codeword c is a codeword of RS code $C_2^{out}$.

The decoding of the C code can be split in 3 steps:
1. Decoding columns by a decoder of $C_1^{in}$;
2. Obtaining word for $C_2^{out}$ by matrix multiplication of $H_2$ and c and then decoding the word by a decoder of $C_2^{out}$;
3. Decoding some columns by a syndrome decoder of $C_2^{in}$ with the use of the decoding results of previous steps.

Notably, a decoding failure for a column of the first decoding step can be used as a signal to erase for the same symbol number as the column number to $C_2^{out}$ decoding of the second decoding step. Error and/or erasure values in $C_2^{out}$ decoding are syndrome values for the column in respect to $H_2$ parity-check matrix. Since matrices $H_2$ and $H_1$ form the parity-check matrix for $C_2^{in}$ code, it is possible to use syndrome values calculated with help of these matrices on first and second decoding steps presented above for decoding the column by syndrome decoder of $C_2^{in}$.

Consider a semi-infinite sequence $\mathcal{B} = \{B_i\}_{i=1}^{\infty}$ of 63×63 matrices over GF(128) such that
1. The matrix $B_1$ is a zero matrix;
2. For each positive integer i greater than 1, the matrix $$\begin{pmatrix} B_{i-1}^T \\ B_i \end{pmatrix}$$

can be split into 3 codewords of the code C as follows: the first 21 columns (from 1 to 21) form the first codeword of C, the second 21 columns (from 22 to 42) form the second codeword of C and the last 21 columns of the matrix (from 43 to 63) form the third codeword of C;

where $B^T$ is the matrix transpose of B.

All possible semi-infinite sequences $\mathcal{B} = \{B_i\}_{i=1}^{\infty}$ of 63 by 63 matrices over GF(128) described above form a spatially coupled code. The encoding of the spatially coupled code under consideration is successive encoding, matrix by matrix, with the use of the encoding procedure for the code C. Namely, we use matrix $B_{i-1}^T$ and 3750 (=1250·3) symbols over GF(128) of the payload as information symbols for 3 GEL codewords, and then obtain 219 (=73·3) check symbols for any positive integer i greater than 1. The payload and obtained check symbols form the matrix $B_i$.

Embodiment 4

Embodiment 4 is based on Embodiment 3.

Let C be a GEL code of length 2646 and dimension 2573 over GF(128) described in Embodiment 3.

Consider semi-infinite sequence $\mathcal{B} = \{B_i\}_{i=1}^{\infty}$ of 63 by 21 matrices over GF(128). Split each matrix $B_i$ into 3 square matrix $B_{i,1}$, $B_{i,2}$ and $B_{i,3}$ of size 21 such that $$B_i = \begin{pmatrix} B_{i,1} \\ B_{i,2} \\ B_{i,3} \end{pmatrix}.$$

Fix function f(x, y) as follows: f(x, 1)=7, f(x, 2)=5 and f(x, 3)=3 for any positive integer x. Fix function p(x, y) such as p(x,1)=3, p(x, 2)=2 and p(x, 3)=1 for any positive integer x. Then, the spatially coupled codes are constructed as follows:
1. The matrices $B_1$, $B_2$, ..., $B_7$ are zero matrices;
2. For each positive integer i greater than 7, the matrix $$\begin{pmatrix} B_{i-f(i,1),p(i,1)}^T \\ B_{i-f(i,2),p(i,2)}^T \\ B_{i-f(i,3),p(i,3)}^T \\ B_{i,1} \\ B_{i,2} \\ B_{i,3} \end{pmatrix} = \begin{pmatrix} B_{i-7,3}^T \\ B_{i-5,2}^T \\ B_{i-3,1}^T \\ B_{i,1} \\ B_{i,2} \\ B_{i,3} \end{pmatrix}$$

is a codeword of C;
where $B^T$ is the matrix transpose of B.

All possible semi-infinite sequences $\mathcal{B} = \{B_i\}_{i=1}^{\infty}$ of 63 by 21 matrices over GF(128) described above form the spatially coupled code under consideration. The encoding of the code is successive encoding, matrix by matrix, with the use of the encoding procedure for the code C. Namely, for any positive integer i greater than 7, we use matrices $B_{i-f(i,1),p(i,1)}^T$, $B_{i-f(i,2),p(i,2)}^T$ and $B_{i-f(i,3),p(i,3)}^T$ and 1250 symbols over GF(128) of the payload as information symbols for a GEL codeword, and then obtain 73 check symbols. The payload and obtained check symbols form the matrix $B_i$.

Figure 10:
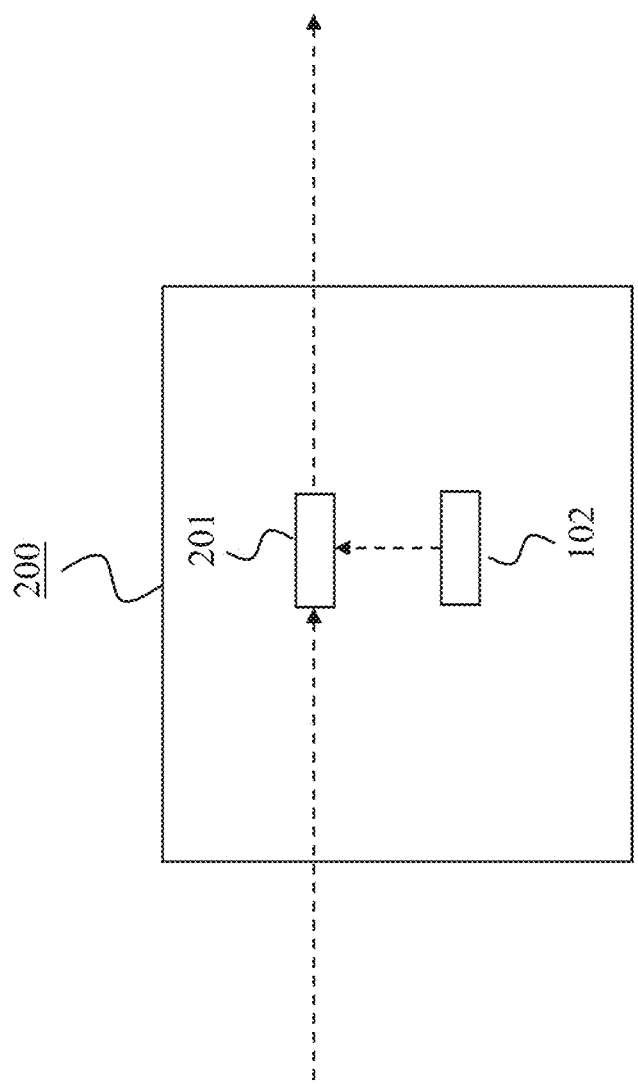
FIG. 10 shows a decoding device according to an embodiment of the present disclosure.

FIG. 10 shows a decoding device 200 according to an embodiment of the present disclosure. In particular, the decoding device 200 is configured to decode a sequence of encoded symbol blocks 201 using a spatially coupled code 102, wherein at least one GEL code is used as component code of the spatially coupled code 102.

The decoding device 200 decodes received FEC encoded symbol blocks. The received symbol blocks at the decoder side are decoded using the same spatially coupled code 102 used at the encoder side. That is, at least one GEL code is used as a component code of the spatially coupled code 102. It should be noted that decoding procedures for both previously described embodiments are as depicted in FIG. 3.

Figure 11:
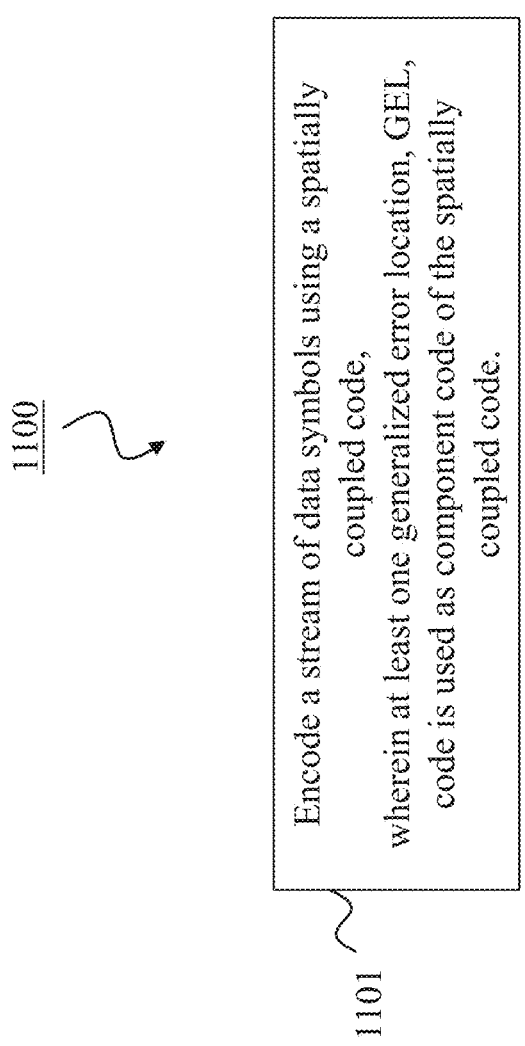
FIG. 11 shows an encoding method according to an embodiment of the present disclosure.

FIG. 11 shows an encoding method 1100 according to an embodiment of the present disclosure. In particular, the method 1100 may be performed by an encoder device as shown in FIG. 8. The encoding method 1100 comprises a step 1101 of encoding a stream of data symbols 101 using a spatially coupled code 102, wherein at least one GEL code is used as a component code of the spatially coupled code 102.

Figure 12:
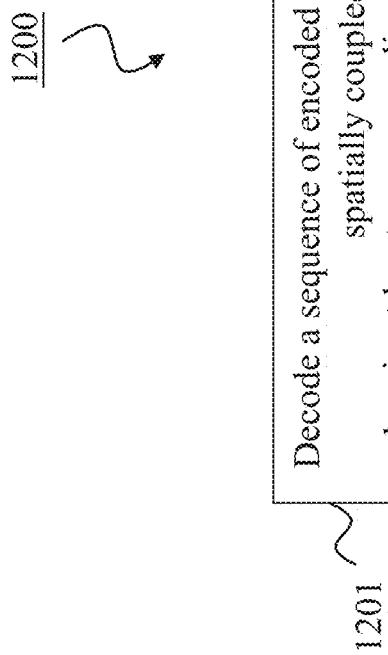
FIG. 12 shows a decoding method according to an embodiment of the present disclosure.

FIG. 12 shows a decoding method 1200 according to an embodiment of the present disclosure. In particular, the method 1200 may be performed by a decoder device as shown in FIG. 10. The decoding method 1200 comprises a step 1201 of decoding a sequence of encoded symbol blocks 201 using a spatially coupled code 102, wherein at least one GEL code is used as component code of the spatially coupled code 102.

Conventional Staircase based on a BCH code that may correct up to 2 errors has a comparatively high error-floor. The designed convolutional Staircase-like GEL code may correct up to 2 errors for each column and up to 3 errors in some columns according to the GEL structure.

Figure 13:
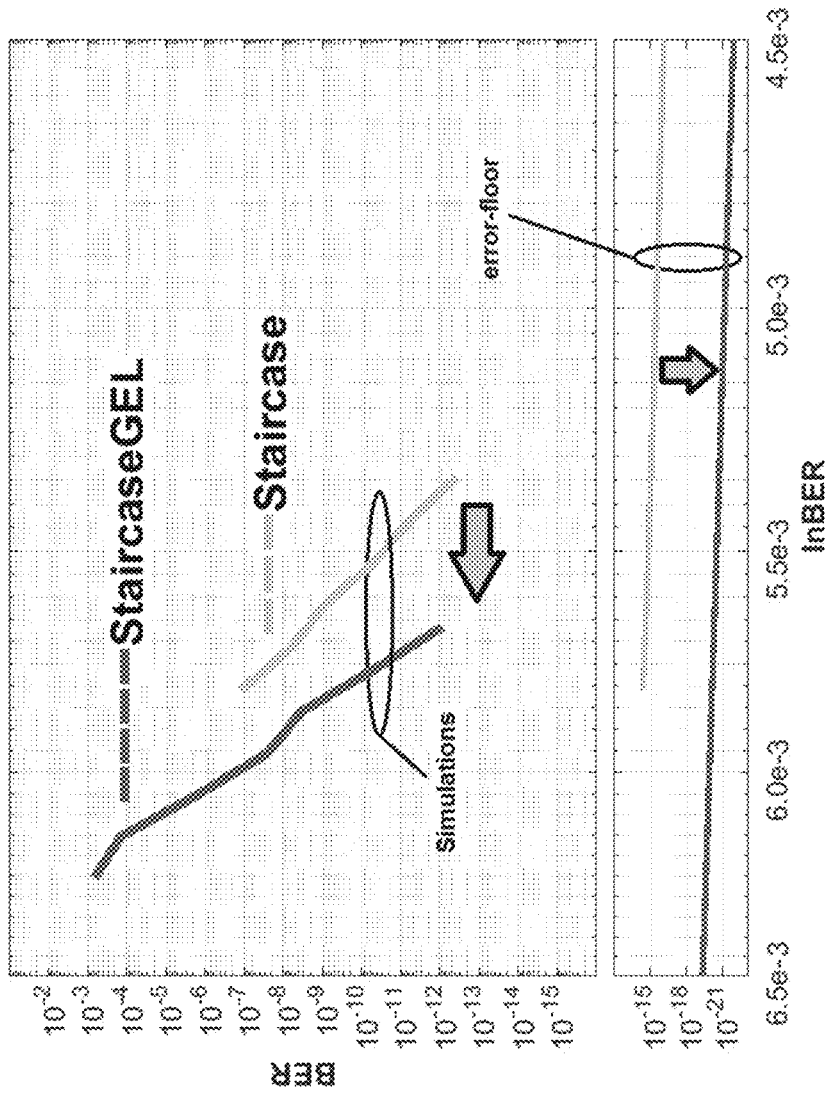
FIG. 13 shows performances and error-floor levels for Staircase-BCH and Staircase-GEL codes.

The resulting FEC has a lower error-floor and a better slope of the performance curve, as shown in FIG. 13. Notice that both FEC have the same overhead and latency. The error-floor level is independent of the latency of the decoding algorithm.

Figure 14:
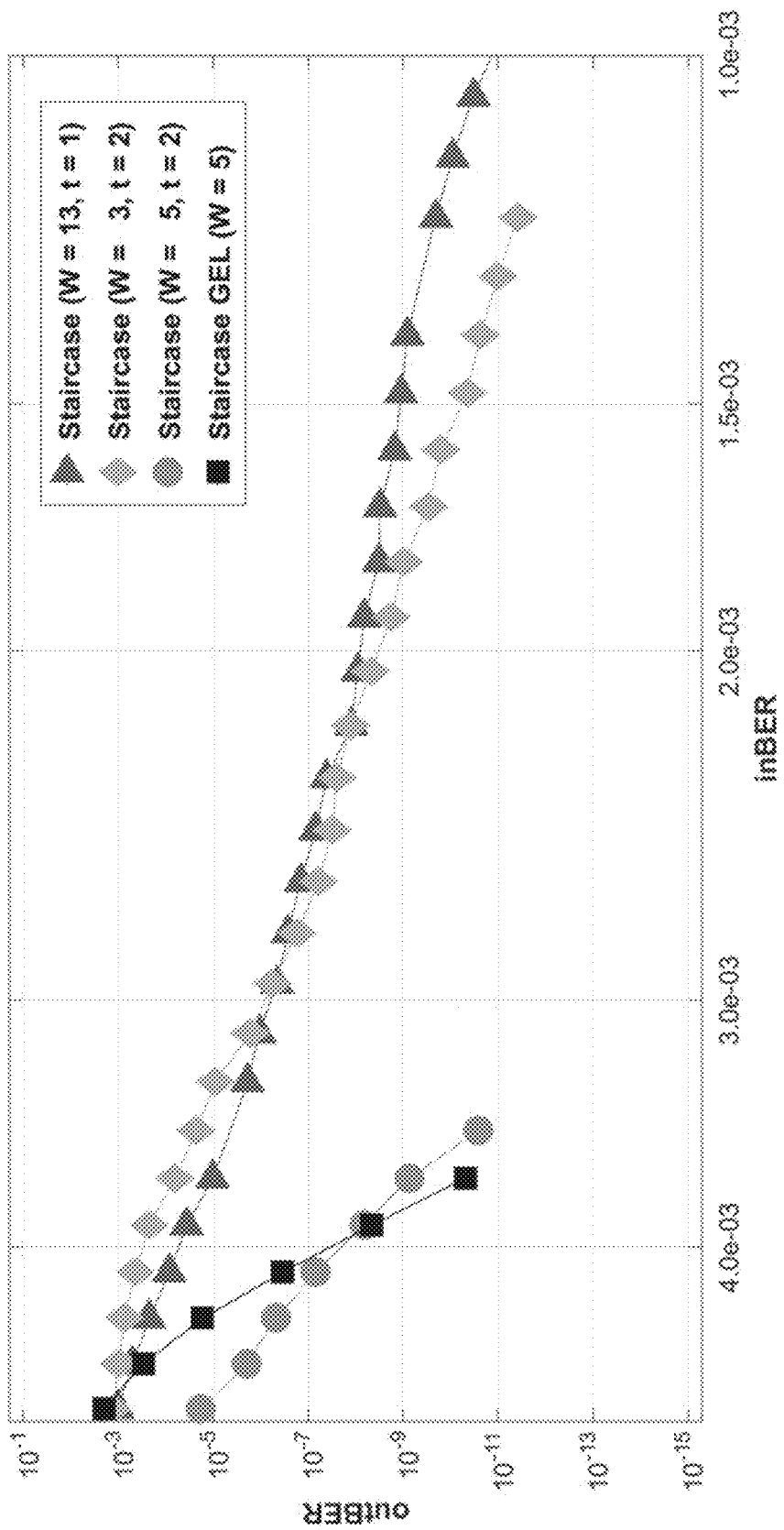
FIG. 14 shows a comparison of Staircase-GEL and Staircase with different component BCH codes and different latencies for decoding (related with the size of the decoding window).

Also, Staircase-GEL is suitable for high-rate and very low-latency constructions, which is unreachable for Staircase-BCH and GEL separately. Let us set the following requirements: a latency less than 174 kbits, a throughput of 800 Gbps, an overhead of 9%, an output bit error rate outBER of 1e-15. The classical Staircase-BCH requires a large window size to avoid poor performance. Staircase-GEL can satisfy all requirements (see Table 2 and FIG. 14).

TABLE 2

Performance vs error-floor level for Staircase-BCH and Staircase-GEL

| EEC | Latency, bits | Block size, bits | Window size | Stall pattern error-floor estimation | | Performance |
|---|---|---|---|---|---|---|
| | | | | nothing | bit-flipping | |
| Staircase (t = 1) | 166.3 K | 11.9 K | 13 | 3.5e-3 @ 1e-6 | 2.7e-3 @ 1e-8 | << 1e-3 @ 1e-15 |
| Staircase (t = 2) | 211.6 K | 52.9 K | 3 | 1.5e-3 @ 3e-16 | 3.0e-3 @ 1e-18 | <1e-3 @ 1e-15 |
| Staircase (t = 2) | 317.4 K | 52.9 K | 5 | 1.5e-3 @ 3e-16 | 3.0e-3 @ 1e-18 | 2.9e-3 @ 1e-15 |
| Staircase GEL | 173.4 K | 28.9 K | 5 | 3.3e-3 @ 2e-16 | — | 3.2e-3 @ 1e-15 |

Performance is obtained by extrapolation of software simulation results up to 1e-11 by output BER.

Figure 15:
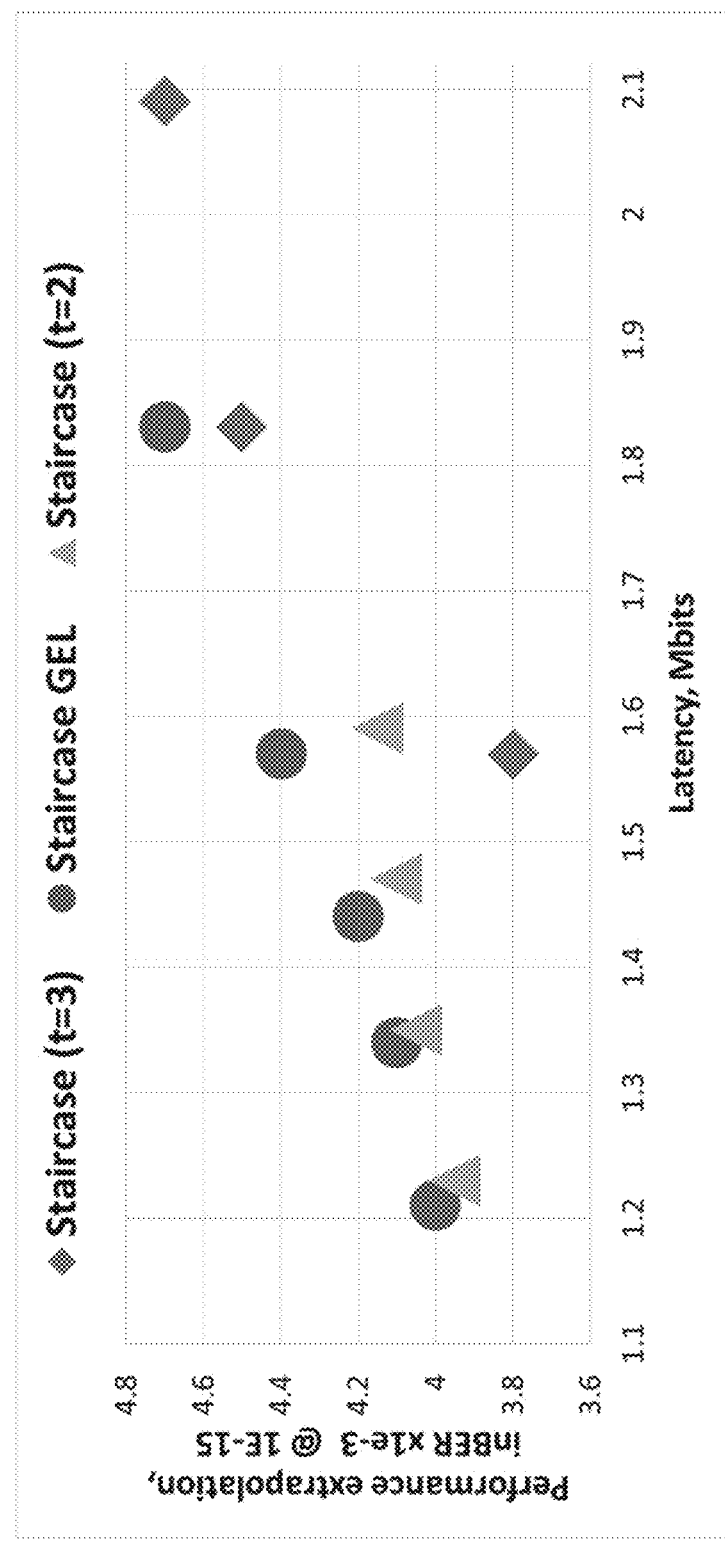
FIG. 15 shows performance vs latency for Staircase-BCH and Staircase-GEL codes.

Other examples of Staircase and Staircase-GEL codes are compared. An overhead of these codes is about 6.67%. In particular, the Staircase-GEL code refers to a Staircase construction with GEL component codes. As can be seen, Staircase-GEL demonstrates better performance in most cases, as shown in Table 3 and FIG. 15.

TABLE 3

Performance vs latency for Staircase-BCH and Staircase-GEL codes

| Staircase (t = 3) | | Staircase GEL | | Staircase (t = 2) | |
|---|---|---|---|---|---|
| Latency, bits | Performance | Latency, bits | Performance | Latency, bits | Performance |
| 2.09M | ≈4.7e-3 | | | Performance saturation | |
| 1.83M | ≈4.5e-3 | 1.83M | ≈4.7e-3 | | |
| 1.57M | ≈3.8e-3 | 1.57M | ≈4.4e-3 | 1.59M | ≈4.15e-3 |
| Not applicable due to short decoding window | | 1.44M | ≈4.2e-3 | 1.47M | ≈4.10e-3 |
| | | 1.34M | ≈4.1e-3 | 1.35M | ≈4.05e-3 |
| | | 1.21M | ≈4.0e-3 | 1.23M | ≈3.95e-3 |

To summarize, a main idea of this present disclosure is to use forward error correction based on spatially coupled codes constructed by using at least one GEL code as block code (component code). One can see that any spatially coupled GEL code can be considered as the subcode of some spatially coupled code, with the same method of spatial coupling and $B_1$ as component code.

The present disclosure has been described in conjunction with various embodiments as examples as well as implementations. However, other variations can be understood and effected by those persons skilled in the art and practicing the claimed present disclosure, from the studies of the drawings, this disclosure and the independent claims. In the claims as well as in the description the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation.

Furthermore, any method according to embodiments of the present disclosure may be implemented in a computer program, having code means, which when run by processing means causes the processing means to execute the steps of the method. The computer program is included in a computer readable medium of a computer program product. The computer readable medium may comprise essentially any memory, such as a ROM (Read-Only Memory), a PROM (Programmable Read-Only Memory), an EPROM (Erasable PROM), a Flash memory, an EEPROM (Electrically Erasable PROM), or a hard disk drive.

Moreover, it is realized by the skilled person that embodiments of the encoding device 100 comprises the necessary communication capabilities in the form of e.g., functions, means, units, elements, etc., for performing the solution. Examples of other such means, units, elements and functions are: processors, memory, buffers, control logic, encoders, decoders, rate matchers, de-rate matchers, mapping units, multipliers, decision units, selecting units, switches, interleavers, de-interleavers, modulators, demodulators, inputs, outputs, antennas, amplifiers, receiver units, transmitter units, DSPs, trellis-coded modulation (TCM) encoder, TCM decoder, power supply units, power feeders, communication interfaces, communication protocols, etc. which are suitably arranged together for performing the solution.

Especially, the processor(s) of the encoding device 100 may comprise, e.g., one or more instances of a Central Processing Unit (CPU), a processing unit, a processing circuit, a processor, an Application Specific Integrated Circuit (ASIC), a microprocessor, or other processing logic that may interpret and execute instructions. The expression "processor" may thus represent a processing circuitry comprising a plurality of processing circuits, such as, e.g., any, some or all of the ones mentioned above. The processing circuitry may further perform data processing functions for inputting, outputting, and processing of data comprising data buffering and device control functions, such as call processing control, user interface control, or the like.

Finally, it should be understood that the present disclosure is not limited to the embodiments described above, but also relates to and incorporates all embodiments within the scope of the appended independent claims.

What is claimed is:

1. An encoding device including a processor configured to:
   encode a stream of data symbols using a spatially coupled code,
   wherein at least one generalized error location, GEL, code is used as a component code of the spatially coupled code, and
   wherein spatially coupled codewords share symbols with previously formed codewords and subsequently formed codewords.

2. The encoding device according to claim 1, wherein the processor is further configured to:
   map the stream of data symbols into a sequence of blocks of symbols, wherein each block of symbols comprises L symbols, L being a positive integer, and a number of data symbols among the L symbols in each block of symbols is less than or equal to L; and
   form a plurality of codewords of the at least one GEL code using one or more symbols of a first block (Bi) and one or more symbols of one or more second blocks (Bj).

3. The encoding device according to claim 2, wherein:
   each codeword of the at least one GEL code comprises information symbols and check symbols, and
   a code length of each codeword of the at least one GEL code is less than or equal to M, M being a positive integer.

4. The encoding device according to claim 3, wherein the processor is further configured to:
   generate the check symbols of each codeword of the at least one GEL code using the one or more data symbols of the first block (Bi) and the one or more symbols of the one or more second blocks (Bj); and
   store the generated check symbols of each codeword of the at least one GEL code in the first block (Bi), wherein a total number of the generated check symbols and data symbols in the first block Bi is equal to L.

5. The encoding device according to claim 2, wherein:
   the processor is further configured to divide each first block (Bi) into a number s of m by m matrices, wherein each first block (Bi) is represented as a (s*m) by m matrix, where s and m are positive integers.

6. The encoding device according to claim 5, wherein the plurality of codewords of the at least one GEL code are represented as a (2*s*m) by m matrix.

7. The encoding device according to claim 5, wherein the processor is further configured to obtain at least one codeword of the plurality of codewords of the at least one GEL code based on the following m by m matrices:
   (i−f(i,1), p(i,1)), (i−f(i,2), p(i,2)), . . . , (i−f(i,s), p(i,s)), (i,1), (i,2), . . . , (i,s), where f(x,y) is an integer valued function and p(x,y) is a permutation function for any x, where f(i,1)>f(i,2)> . . . >f(i,s)>0 for any positive integer i, and a value domain of the integer valued function p(x,y) is {1,2, . . . , s}.

8. The encoding device according to claim 2, wherein each symbol of the first block (Bi) is used as either an information symbol or a check symbol for a respective codeword of the at least one GEL code.

9. The encoding device according to claim 3, wherein all symbols of the first block (Bi) and the one or more symbols of the one or more second blocks (Bj) are represented as an n by N matrix, n and N being positive integers.

10. The encoding device according to claim 9, wherein the plurality of codewords of each GEL code are represented as a matrix with n rows and a number of columns less than or equal to N.

11. The encoding device according to claim 9, wherein a sum of lengths of all codewords of the plurality of codewords of the at least one GEL code is equal to n*N.

12. A decoding device including a processor configured to:
   decode a sequence of encoded symbol blocks using a spatially coupled code,
   wherein at least one generalized error location, GEL, code is used as a component code of the spatially coupled code, and
   wherein spatially coupled codewords share symbols with previously formed codewords and subsequently formed codewords.

13. An encoding method implemented in a processor, the method comprising:
   encoding a stream of data symbols using a spatially coupled code,
   wherein at least one generalized error location, GEL, code is used as a component code of the spatially coupled code, and
   wherein spatially coupled codewords share symbols with previously formed codewords and subsequently formed codewords.

14. A decoding method implemented in a processor, the method comprising:
   decoding a sequence of encoded symbol blocks using a spatially coupled code,
   wherein at least one generalized error location, GEL, code is used as a component code of the spatially coupled code, and
   wherein spatially coupled codewords share symbols with previously formed codewords and subsequently formed codewords.

* * * * *